(12) United States Patent
Schneiker

(10) Patent No.: US 7,279,686 B2
(45) Date of Patent: Oct. 9, 2007

(54) INTEGRATED SUB-NANOMETER-SCALE ELECTRON BEAM SYSTEMS

(75) Inventor: Conrad W. Schneiker, Tuscon, AZ (US)

(73) Assignee: Biomed Solutions, LLC, Pittsford, NY (US)

( * ) Notice: Subject to any disclaimer, the term of this patent is extended or adjusted under 35 U.S.C. 154(b) by 230 days.

(21) Appl. No.: 10/983,566

(22) Filed: Nov. 8, 2004

(65) Prior Publication Data

US 2005/0092929 A1 May 5, 2005

Related U.S. Application Data

(63) Continuation-in-part of application No. 10/615,499, filed on Jul. 8, 2003, now Pat. No. 6,815,688, and a continuation-in-part of application No. 10/615,452, filed on Jul. 8, 2003, now Pat. No. 6,943,356.

(51) Int. Cl.
*G21K 1/08* (2006.01)

(52) U.S. Cl. ............... 250/396 R; 250/313; 250/361.1; 445/24

(58) Field of Classification Search ............. 250/396 R
See application file for complete search history.

(56) References Cited

U.S. PATENT DOCUMENTS

| | | | |
|---|---|---|---|
| 3,780,334 A | 12/1973 | Leboutet | |
| 4,680,467 A | 7/1987 | Bryson, III et al. | |
| 4,939,363 A | 7/1990 | Bando et al. | |
| 5,122,663 A * | 6/1992 | Chang et al. | 250/310 |
| 5,233,205 A | 8/1993 | Usagawa et al. | |
| 5,247,223 A | 9/1993 | Mori et al. | |
| 5,393,647 A | 2/1995 | Neukermans et al. | |
| 5,587,586 A | 12/1996 | Kruit | |
| 5,633,502 A | 5/1997 | Fischione | |
| 5,654,548 A | 8/1997 | Fink et al. | |
| 5,940,678 A | 8/1999 | Doong et al. | |
| 5,986,264 A | 11/1999 | Grunewald | |
| 6,005,247 A | 12/1999 | Baum | |
| 6,020,677 A | 2/2000 | BlanchetFincher et al. | |
| 6,023,060 A * | 2/2000 | Chang et al. | 250/310 |
| 6,043,491 A | 3/2000 | Ose et al. | |
| 6,060,839 A | 5/2000 | Sverdrup, Jr. et al. | |
| 6,100,639 A | 8/2000 | Sverdrup, Jr. et al. | |
| 6,140,652 A | 10/2000 | Shlepr et al. | |
| 6,159,742 A | 12/2000 | Lieber et al. | |
| 6,188,068 B1 | 2/2001 | Shaapur et al. | |
| 6,194,720 B1 | 2/2001 | Li et al. | |
| 6,195,214 B1 * | 2/2001 | Muray et al. | 359/819 |
| 6,214,651 B1 | 4/2001 | Cox | |
| 6,300,631 B1 | 10/2001 | Shofner | |
| 6,369,385 B1 * | 4/2002 | Muray et al. | 250/306 |
| 6,417,060 B2 | 7/2002 | Tavkhelidze et al. | |
| 6,680,214 B1 | 1/2004 | Tavkhelidze et al. | |
| 6,771,012 B2 * | 8/2004 | Ahmed et al. | 313/336 |
| 2005/0084980 A1 * | 4/2005 | Koo et al. | 436/171 |

\* cited by examiner

*Primary Examiner*—David A. Vanore
*Assistant Examiner*—James J Leybourne
(74) *Attorney, Agent, or Firm*—Neal L. Slifkin; Robert C. Brown

(57) ABSTRACT

A solid state sub-nanometer-scale electron beam emitter comprising a multi-layered structure having a nano-tip electron emitter and tunnel emission junction formed on substrate, an initial electron beam extraction electrode, a "nano-sandwich Einzel" electrode, and a topmost protective layer.

27 Claims, 24 Drawing Sheets

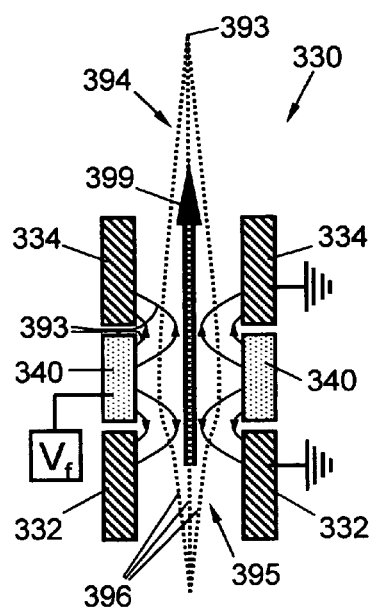
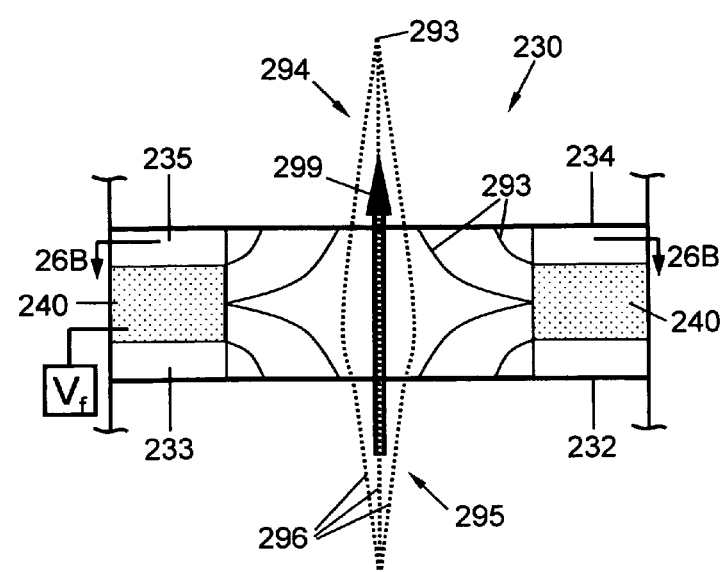
FIG. 25    FIG. 26A
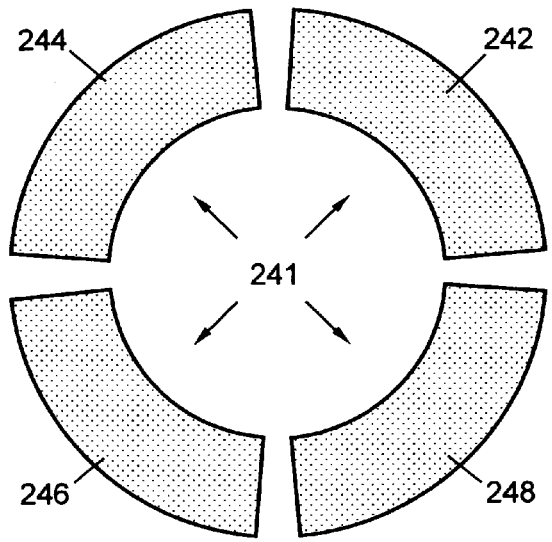
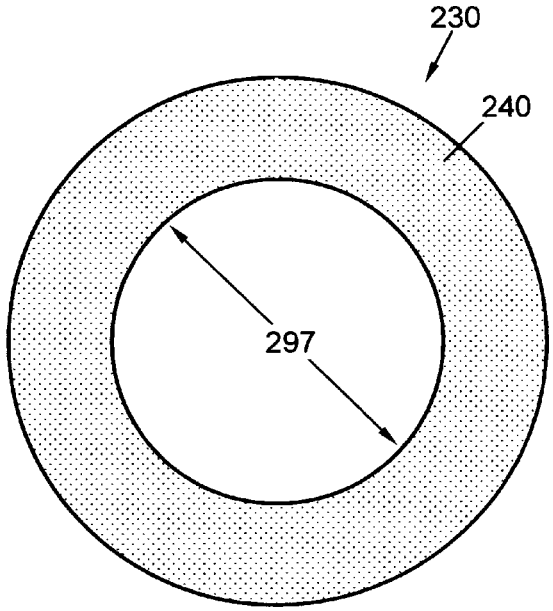
FIG. 26C    FIG. 26B

INTEGRATED SUB-NANOMETER-SCALE ELECTRON BEAM SYSTEMS

CROSS-REFERENCE TO RELATED PATENT APPLICATIONS

This application is a continuation-in-part of applications, U.S. Ser. No. 10/615,452, now U.S. Pat. No. 6,943,356 and U.S. Ser. No. 10/615,499, now U.S. Pat. No. 6,815,688 both filed Jul. 8, 2003.

This invention relates generally to highly miniaturized electron beam sources, and particularly to sub-nanometer-scale electron beam sources and systems, fabrication methods thereof, and uses thereof.

As used herein, "sub-nanometer-scale electron beam" designates an electron beams that has most of its energy concentrated in a diameter of approximately one nanometer or less at its point of origin, and possibly also likewise in scale at its principal focal point. Other parts of the beam may be up to 10 times or even 100 times smaller or larger, depending upon the specific application.

FIELD OF THE INVENTION

Small-scale electron beam sources, and sub-nanometer-scale electron beam sources, systems, fabrication methods, and uses thereof in particular.

BACKGROUND OF THE INVENTION

Many analytical devices, such as electron microscopes, are used to image the topography and surface properties of a substrate. These devices utilize a focused beam of electrons to illuminate a substrate. Sources of these electron beams are often contained in the tips of the analytical device.

Electron point sources, which may be utilized in these analytical devices, are well known. These electron point sources, often on the order of the atomic scale and adapted to provide field emission of coherent electron beams, have been described in, e.g., "Coherent point source electron beams", Hans-Werner Fink, Werner Stocker, and Heinz Schmid, Journal of Vacuum Science and Technology B, Volume 8, Number 6, Nov./Dec. 1990, pp. 1323-1324, in "Unraveling nanotubes: field emission from an atomic wire," A. G. Rinzler, J. H. Hafner, P. Nikolaev, L. Lou, S. G. Kim, D. Tomanek, P. Nordlander, D. T. Colbert and R. E. Smalley, Science, 269, pp. 1550-1553 (1995), and in "Carbon nanotubes are coherent electron sources", Heinz Schmid, Hans-Werner Fink, Applied Physics Letters, Volume 70, Number 20, 19 May 1997, pp. 2679-2680. The first reference discloses a tungsten tip terminated with an atomically perfect pyramid of tungsten atoms as the electron emitter. The second and third references disclose a carbon nanotube as the electron emitter.

By way of further illustration, U.S. Pat. No. 5,654,548 ("Source for intense coherent electron pulses") discloses how such sources can be used for one type of electron microscopy. The entire disclosure of this United States patents is hereby incorporated by reference into this specification.

Electron beams have been used in constructing microscopes. For example, U.S. Pat. No. 6,005,247 (Electron beam microscope using electron beam patterns) discloses "An electron beam microscope includes an electron beam pattern source, a vacuum enclosure, electron optics, a detector and a processor." U.S. Pat. No. 6,043,491 (Scanning electron microscope) discloses "A scanning electron microscope in the present invention, by employing a retarding method and suppressing interferences between an electron beam and secondary electrons or back scattered electrons, makes it possible to obtain a clearer SEM image with a higher resolution." The entire disclosure of each of these United States patents is hereby incorporated by reference into this specification.

Field emitted electron beams are also useful in many types of vacuum microelectronic devices, as described in "Vacuum Microelectronics," edited by Wei Zhu, (John Wiley & Sons, New York, 2001).

Fabrication of specialized tips used in scanning electron microscopes and atomic force microscopes is well known to those skilled in the arts. For example, U.S. Pat. No. 6,020,677 (Carbon cone and carbon whisker field emitters) discloses "Carbon cone and carbon whisker field emitters are disclosed. These field emitters find particular usefulness in field emitter cathodes and display panels utilizing said cathodes." U.S. Pat. No. 5,393,647 (Method of making superhard tips for micro-probe microscopy and field emission) discloses "Forming micro-probe tips for an atomic force microscope, a scanning tunneling microscope, a beam electron emission microscope, or for field emission, by first thinning a tip of a first material, such as silicon." The entire disclosure of each of these United States patents is hereby incorporated by reference into this specification.

The prior art sources of atomic point source electron beam emitters typically must be operated at very low pressures, on the order of about 10-8 to 10-10 Torr, to protect them from disruptive contamination, chemical degradation, or destructive ion bombardment by residual gas ions. This often requires the use of complicated, expensive, and cumbersome equipment.

Carbon-based nanotubes may be configured as superconducting nano-channels. Nanotubes are resilient and have nanometer-scale, sharp tips. As such, they are useful for making micro-probe tips of microscopy devices, e.g., scanning tunneling microscope and atomic force microscope. The dimensions of carbon-based nanotubes, ideally having a single atom at the tip apex, but typically being 3 to 10 atoms in diameter at the tip, allows the tip to be positioned close enough to a conducting substrate so that a tunneling current flows between the tip and the substrate under an applied bias voltage. This tunneling current is similar to the tunneling of electrons across a barrier as described by the Josephson tunneling effect, which is obtained from a system comprising two layers of superconductive material separated by a barrier. The two layers are either connected by a very narrow conductive bridge, or are separated by a layer of nonconductive material. When this system is under superconducting conditions (low temperature), a tunneling effect takes place, in which a superconducting current or super current flows across the barrier between the superconductive layers.

In the case of carbon-based superconducting nanotubes, the barrier is the repulsive force of the Meissner effect between the superconducting carbon-based nanotube and substrate. The Meissner effect is the ability of a material in a superconducting state to expel all magnetic fields therefrom (i.e., such a superconductor is perfectly diamagnetic and exhibits a permeability of zero). Reference may be had to "The Further Inventions of Daedalus", by David E. H. Jones, Oxford Press, 1999. In the section relating to "Electric Gas Light on Tap" (pages 174-175) the author describes methods for exploiting the Meissner effect of evacuated superconducting tubes for purposes of residential electric beam-based power distribution. Further reference may be had, e.g., to U.S. Pat. No. 4,975,669 (Magnetic bottle employing Meissner effect). The entire disclosure of this United States patent is hereby incorporated by reference into this specification. Atomic force microscopes, which rely on the repulsive force generated by the overlap of the electron cloud at the tip's surface with electron clouds of surface atoms within the substrate, negate the need of conducting substrates to obtain the same effect.

As used herein, the term "nanotube" refers to a hollow structure having a diameter of from about 0.3 to about 10 nanometers, and a length of from about 3 to about 10,000 nanometers. In general, such nanotubes have aspect ratios of at least about 1:10 to about 1:1000. Carbon-based nanotubes are hollow structures composed between 95-to 100% of carbon atoms. In general, the most commonly studied forms of nanotubes have physical properties such that they conduct electricity better than copper. Typically, carbon nanotubes have tensile strength 100 times that of steel. Carbon nanotubes become superconductors at very low temperatures. Nanotubes may be fabricated from materials other than carbon, e.g., Tungsten disulphide, Molybdenum disulphide, and Boron nitride. Carbon nanotubes may be capped with metallic cores. Carbon nanotubes can be doped with other elements, e.g. metals.

Carbon-based nanotubes may be either single-walled nanotubes (SWNT) or multi-walled nanotubes (MWNT). A MWNT includes several nanotubes each having a different diameter. Thus, the smallest diameter nanotube is encapsulated by a larger diameter nanotube, which in turn, is encapsulated by another larger diameter nanotube.

The prior art sources of atomic point source electron beam emitters typically must be operated at very low pressures, on the order of about 10-8 to 10-10 Torr, to protect them from disruptive contamination, chemical degradation, beam scattering or destructive ion bombardment by residual gas ions. This often requires the use of complicated, expensive, and cumbersome equipment.

Carbon-based nanotubes are used to form superconducting nanochannels for steering and channeling very fine electron beams or other charged particles. In order to preserve near perfect vacuum and ultra-clean conditions, the outlet ends of the superconducting nanochannels are sealed with electron transparent nano-membranes.

Fabrication of specialized tips comprising carbon-based nanotubes and its use in scanning electron microscopes and atomic force microscopes is well known to those skilled in the arts. For example, U.S. Pat. No. 6,020,677 (Carbon cone and carbon whisker field emitters) discloses "Carbon cone and carbon whisker field emitters. These field emitters find particular usefulness in field emitter cathodes and display panels utilizing said cathodes." U.S. Pat. No. 5,393,647 (Method of making super hard tips for micro-probe microscopy and field emission) discloses "Forming micro-probe tips for an atomic force microscope, a scanning tunneling microscope, a beam electron emission microscope, or for field emission, by first thinning a tip of a first material, such as silicon." The entire disclosure of each of these United States patents is hereby incorporated by reference into this specification.

Electron transparent nano-membranes are well known to those skilled in the art. Reference may be had, e.g., to U.S. Pat. No. 6,300,631 (Method of thinning an electron transparent thin film membrane on a TEM grid using a focused ion beam), U.S. Pat. No. 6,194,720 (Preparation of transmission electron microscope samples), U.S. Pat. Nos. 6,188, 068, 6,140,652, 6,100,639, 6,060,839, 5,986,264, 5,940,678 (Electronic transparent samples), U.S. Pat. Nos. 5,633,502, 4,680,467, 3,780,334 (Vacuum tube for generating a wide beam of fast electrons), and the like. The entire disclosure of each of these United States patents is hereby incorporated by reference into this specification.

The prior art sources of carbon-based nanotube applications for microscopy devices typically consist of attaching a carbon-based nanotube to the tip of a microscopy probe. The prior art, however, does not include microscopy probes incorporating superconducting nano-channels comprising carbon-based nanotubes, which are capable of guiding and manipulating charged particle beams for microscopy applications. In the remainder of this specification reference will be made to the use of single walled superconducting carbon nanotubes. However, it is to be understood that multi-walled superconducting carbon nanotubes may be utilized as well, as may be any other essentially atomically perfect nanotube structure, which, if not naturally superconducting, may be optionally externally coated with a thin film of superconducting material.

The semiconductor integrated circuit revolution of recent decades has been driven by drastic cost reductions in steadily improving technological capabilities, which generated very much greater offsetting gains in total market size. So far, this remarkable resource has not been widely harnessed for some key electron beam technologies of great importance to nanotechnology although some intriguing preliminary work has been done in the field of vacuum microelectronic devices. There is enormous untapped technical and commercial potential for nanotechnology-related applications involving substantial improvements in the high-leverage technologies of electron beam nano-lithography and nanometer resolution scanning electron microscopes (among others), which may be significantly improved by use of the sub-nanometer-scale electron beam systems of the present invention.

The nano-electron-beam approach to these technologies involves greatly miniaturizing the electron-beam source system to microscopic, sub-micron dimensions by use of the sub-nanometer-scale electron beam systems of the present invention, leading to reduced cost and increased performance. This approach can exploit integrated circuit manufacturing technologies for mass-producing sub-nanometer-scale electron beam systems of the present invention that each incorporate thousands of such nano-electron-beam sources into an overall system such as e.g., an electron beam nano-lithography system for writing integrated circuit patterns on substrates, and a nanometer resolution scanning electron microscope for detailed imaging of nanometer-scale structures. Such overall multi-nano-electron-beam systems would have greatly increased capabilities compared to present systems.

There are a number of major applications for such improved capabilities, including but not limited to the following:

1. Massively parallel nano-electron-beam sources may render electron beam lithography suitable or even preferable for the nano-lithography realm. This would once again enable its viability for semiconductor manufacturing, which is presently increasingly dominated by ever-more extraordinarily expensive deep UV optical lithography.

2. Massively parallel nano-electron-beam SEM (scanning electron microscopy) would be very useful for various inspection and screening operations in materials science and molecular biotechnology. In another embodiment, individual SEMs or more limited numbers of parallel SEMs of microscopic size could be developed for medical applications.
3. The above embodiments of electron-beam-based nano-lithographic and nano-SEM capabilities may be combined for purposes of economical nano-manipulation, nano-processing (e.g., welding, cutting, deposition), and nano-assembly operations involving a wide range of nanostructures, such as carbon nanotubes.
4. Massively parallel nano-electron-beam sources may prove useful for ultra-high density, high speed data storage and retrieval.
5. Massively parallel nano-electron-beam sources may prove useful for small, high resolution, high speed video displays.
6. Nano-sources of nano-electron-beams hold intriguing potential for use in components for some specialized embodiments of extremely high performance analog electronic systems.
7. There are potential applications involving the ongoing quest for smaller, lighter, and more radiation-resistant sources of high-power, ultra-high-frequency, sub-millimeter-microwave beams for space and aerospace applications.

It is an object of this invention to provide a highly miniaturized electron beam source.

It is an object of this invention to provide a highly miniaturized electron beam lens.

SUMMARY OF THE INVENTION

In accordance with the present invention, there is provided a solid state sub-nanometer-scale electron beam emitter comprising a nano-tip electron emitter and tunnel emission junction formed on substrate, an initial electron beam extraction electrode, and an electron beam lens.

In accordance with the present invention, there is further provided a solid state sub-nanometer-scale electron beam emitter comprising a nano-tip electron emitter and tunnel emission junction formed on substrate, an initial electron beam extraction electrode, and a protective layer disposed on said initial electron beam extraction electrode.

In accordance with the present invention, there is further provided a nano-sandwich Einzel lens for directing an electron beam, said lens comprising a lower primary electron beam acceleration electrode, an annular metal electrode, and an upper metal membrane electrode.

BRIEF DESCRIPTION OF THE DRAWINGS

The invention will be described by reference to the following drawings, in which like numerals refer to like elements, and in which:

FIG. 25 is a cross sectional schematic diagram of a conventional Einzel electrostatic focusing lens for focusing an electron beam passing therethrough;

FIG. 26A is a detailed cross sectional view of one embodiment of a "nano-sandwich Einzel" lens of the nano-emitter system of FIG. 24A;

FIG. 26B is an axial cross sectional view of the lens of FIG. 26A, taken along the line 26B-26B of FIG. 26A; and FIG. 26C is an axial cross sectional view of the lens of FIG. 26A wherein the central electrode thereof is comprised of a plurality of segments.

Figure 1:
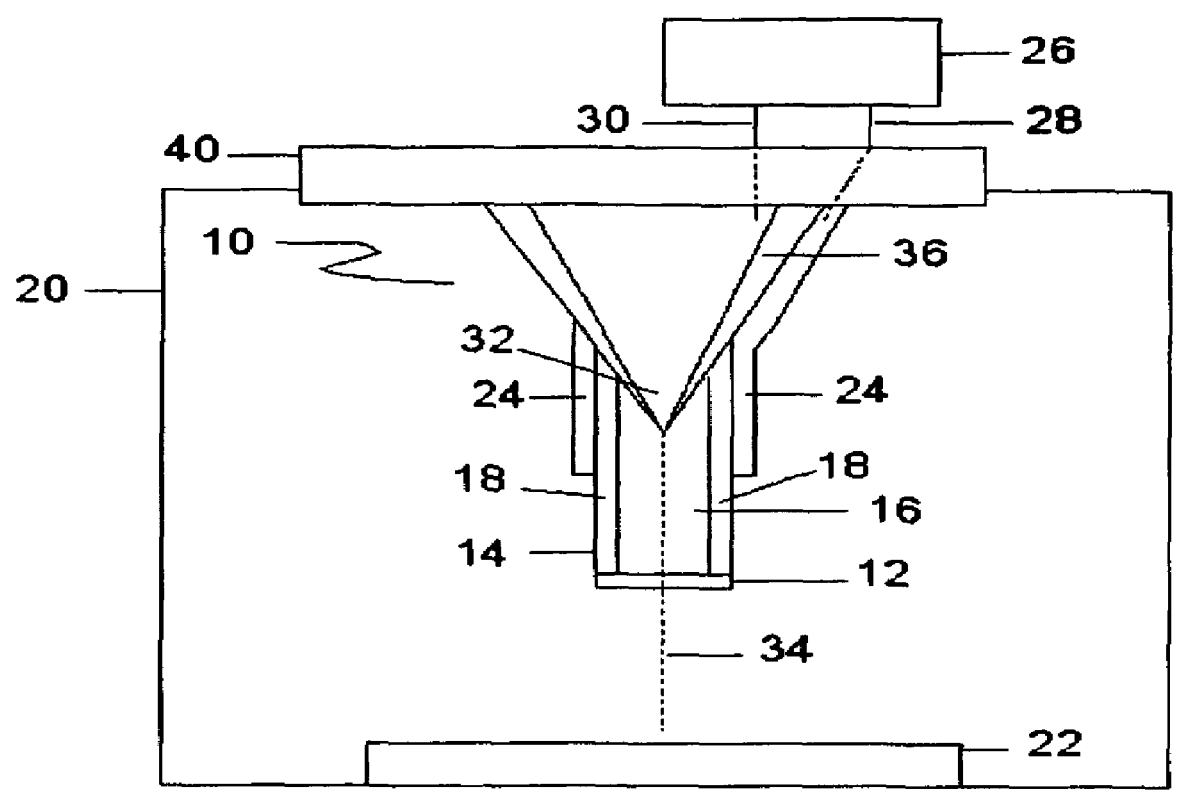
FIG. 1 is a schematic representation of an enclosed point source electron beam generator.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENTS

For a general understanding of the present invention, reference is made to the drawings. In the drawings, like reference numerals have been used throughout to designate identical elements. In describing the present invention, a variety of terms are used in the description. As used herein unless otherwise specified, the term electron beam as used throughout this specification is meant to include any beam comprising charged particles as is known to those skilled in the art.

Atomic scale point source electron beams have many potential advantages for scanning electron microscopy, including higher resolution at lower voltages in much more compact configurations; these electron beam sources also are advantageously used in vacuum microelectronic devices. The primary disadvantage is the requirement for operation at ultra-high vacuum when used as electron field emitters to avoid damage by ion bombardment. By using a miniature ultra-high vacuum chamber to permanently enclose the field emission part, the vacuum requirements for the rest of a scanning electron microscope can be greatly relaxed, leading to major operational and economic advantages, and a much wider range of practical application of this uniquely advantageous point source of coherent electron beams.

In one embodiment, the invention of this patent application comprises the structure and utilization of a monoatomic tip in place of conventional field emission sources, providing a far superior initial electron beam in terms of narrow beam divergence and narrow energy spread and greatly reducing the requirements for high beam voltages and expensive electron optical systems needed for very high resolution imaging.

The enclosed point source electron beam generator described in this specification may operate with a miniature ultra-high vacuum enclosure with an electron-transparent window. This enables the rest of the system to be operated under more conventional vacuum conditions. The rest of the system may comprise conventional or, due to the very narrow electron beam sources produced at relatively low voltages, greatly miniaturized versions of conventional scanning electron microscopes, scanning transmission microscopes, point projection Fresnel microscopes, electron beam lithography systems, and vacuum microelectronic devices.

An alternative means of generating very fine electron beams at low voltages (about 50 to 500 volts) from a conventional electron beam and coupling it to a superconducting nano-channel is also disclosed. Such beams can be used for the microscopy systems and vacuum microelectronic devices.

Very fine electron beams from any of the above sources may be guided and/or manipulated by superconducting nano-channels.

As is known to those in the field of electron beam technology, suitably oriented magnetic fields may be used to confine electron beams for some distance once they have been suitably created and formed. The small size of the electron beam source of this invention and the ability to position it close to the ultimate target makes it feasible to wholly immerse the entire source-to-target system in the bore of a powerful magnetic field generating system whose internal magnetic field is oriented parallel to the main electron beam axis. The magnetic field system, depending on system size and performance requirements, may employ permanent magnets or conventional electromagnets or superconducting electromagnets, optionally augmented with magnetic pole pieces, following common practices well known to those in the art. Immersing the entire system in this magnetic field has the net effect of causing electrons that would normally radially diverge from the main beam axis to instead spiral around it. For scanning electron microscopy or scanning electron beam surface modification applications, either the source or target would need to be mechanically scanned relative to the other. Such scanning may for instance be implemented by any of the lateral electro-mechanical scanning techniques that are used for scanning tunneling microscopes or atomic force microscopes, following common practices well known to those in the field.

In the remainder of this specification reference will be made to the use of single walled superconducting carbon nanotubes. However, it is to be understood that multi-walled superconducting carbon nanotubes may be utilized as well, as may be any other essentially atomically perfect nanotube structure, which, if not naturally superconducting, may be optionally externally coated with a thin film of superconducting material.

In the preferred embodiment illustrated in FIG. 1, there is illustrated a tip assembly 10 comprised of a high quality electron-transparent thin wall 12 positioned at the distal end 14 of an ultra-high vacuum chamber 16.

The thin wall 12 is electron-transparent, i.e., electron beams may be passed through it without significant dispersion or attenuation, relative to the intended application. Electron transparency is a function of electron energy and the type and thickness of the thin will material. Using means well known to those skilled in the art, the initial electron beam energy would be set for attaining an acceptable level of electron transparency for a particular thin wall material, and then, if needed, the electron beam energy would subsequently be raised or lowered as appropriate for the intended application.

Electron-transparent thin-walls and structures and materials comprising them are well known to those skilled in the art. Reference may be had, e.g., to U.S. Pat. No. 6,300,631 (Method of thinning an electron transparent thin film membrane on a TEM grid using a focused ion beam), U.S. Pat. No. 6,194,720 (Preparation of transmission electron microscope samples), U.S. Pat. Nos. 6,188,068, 6,140,652, 6,100, 639, 6,060,839, 5,986,264, 5,940,678 (electronic transparent samples), U.S. Pat. Nos. 5,633,502, 4,680,467, 3,780,334 (Vacuum tube for generating a wide beam of fast electrons), and the like. The entire disclosure of each of these United States patents is hereby incorporated by reference into this specification.

Referring again to FIG. 1, and in the embodiment depicted, wall 12 is preferably a film that preferably has a thickness of from about 1 to about 50 nanometers. In one preferred embodiment, film 12 consists essentially of silicon nitride, boron nitride, or diamond.

The wall 12, in combination with wall 18, defines a chamber 16. The vacuum within chamber 16 is preferably greeter than about $10^{-7}$ Torr. In one aspect of this embodiment, the vacuum within chamber 16 is from about $10^{-7}$ to about $10^{-10}$ Torr.

The vacuum within chamber 16 may be created by conventional means. In one embodiment, (not shown) the tip assembly 10 is placed within an ultra high vacuum chamber (not shown) during its manufacturing assembly process and chamber 16 is vacuum sealed to the electron transparent wall 12 thus enclosing an ultra high vacuum within chamber 16.

The chamber 16 has a relatively small volume, of preferably less than about 1 cubic millimeter. In one embodiment, the chamber 16 has a volume of less than about 0.1 cubic millimeters.

Referring again to FIG. 1, it will be seen that the tip assembly 10 is utilized within a sample vacuum chamber 20 whose volume may be at least about 1,000 times as great as the volume of chamber 16. However, the vacuum in chamber 20 may be substantially lower than the vacuum in chamber 16. The pressure in chamber 20 is typically at least about 10 to 1,000 times as great as the pressure within chamber 16.

Referring again to FIG. 1, and in the preferred embodiment depicted therein, the tip assembly 10 is disposed above sample 22 and can be moved, by means described elsewhere in this specification, so that it is closer to or further away from sample 22.

Referring again to FIG. 1, and in the preferred embodiment depicted therein, an extraction electrode assembly 24 is preferably disposed around chamber 16. Electrode assembly 24 is electrically connected to external voltage supply 26 by means of conductors 28 and 30.

In another embodiment, not shown, the extraction electrode assembly 24 is disposed within chamber 24.

In one embodiment, the extraction electrode assembly 24 is electrically charged to an electrical potential typically in the range 50 to 500 volts with respect to the field emission tip 32 (which is the mono-atomic point source of electron beam 34).

In the embodiment depicted in FIG. 1, tip assembly 10 may comprise either a single or multi walled carbon nanotube 32 or a tungsten mono-atomic point emitter (not shown). Reference may be had to U.S. Pat. No. 6,159,742 (Nanometer-scale microscopy probes), U.S. Pat. No. 4,939,363 (Scanning tunneling microscope), and the like. The entire disclosure of each of these United States patents is hereby incorporated by reference into this specification.

The extraction electrode assembly 24 may optionally be fashioned from a superconducting material to take advantage of the Meissner effect for narrowing the emission cone of electrons from the emitter due to the superconducting material's expulsion and thus confinement of the magnetic fields of the emerging electrons. The Meissner effect is the ability of a material in a superconducting state to expel all magnetic fields therefrom (i.e., such a superconductor is perfectly diamagnetic and exhibits a permeability of zero). Reference may be had, e.g., to U.S. Pat. No. 4,975,669 (Magnetic bottle employing Meissner effect). The entire disclosure of this United States patent is hereby incorporated by reference into this specification.

Referring again to FIG. 1, and in the preferred embodiment depicted therein, the emission tip 32 is attached to an electrically insulating tip enclosure 36 to isolate the tip 32 from electrode 24. An electrical connection is made from the voltage source 26 to the electrode 24 by means of conductor 28. An electrical connection is made from the voltage source 26 to the tip 32 by means of conductor 30. The entire assemblage is attached to an electrically insulating supporting mount 40.

In this preferred embodiment, the beam extraction voltage preferably is selected according to the type of ultra thin film material used for the electron window 12, since, as is known to those skilled in the arts, transparency is energy dependent After passage through the electron window 12, the beam 34 can subsequently be accelerated or decelerated as needed to a target-relative voltage in the range of about 20 to 1,000 volts.

Figure 2:
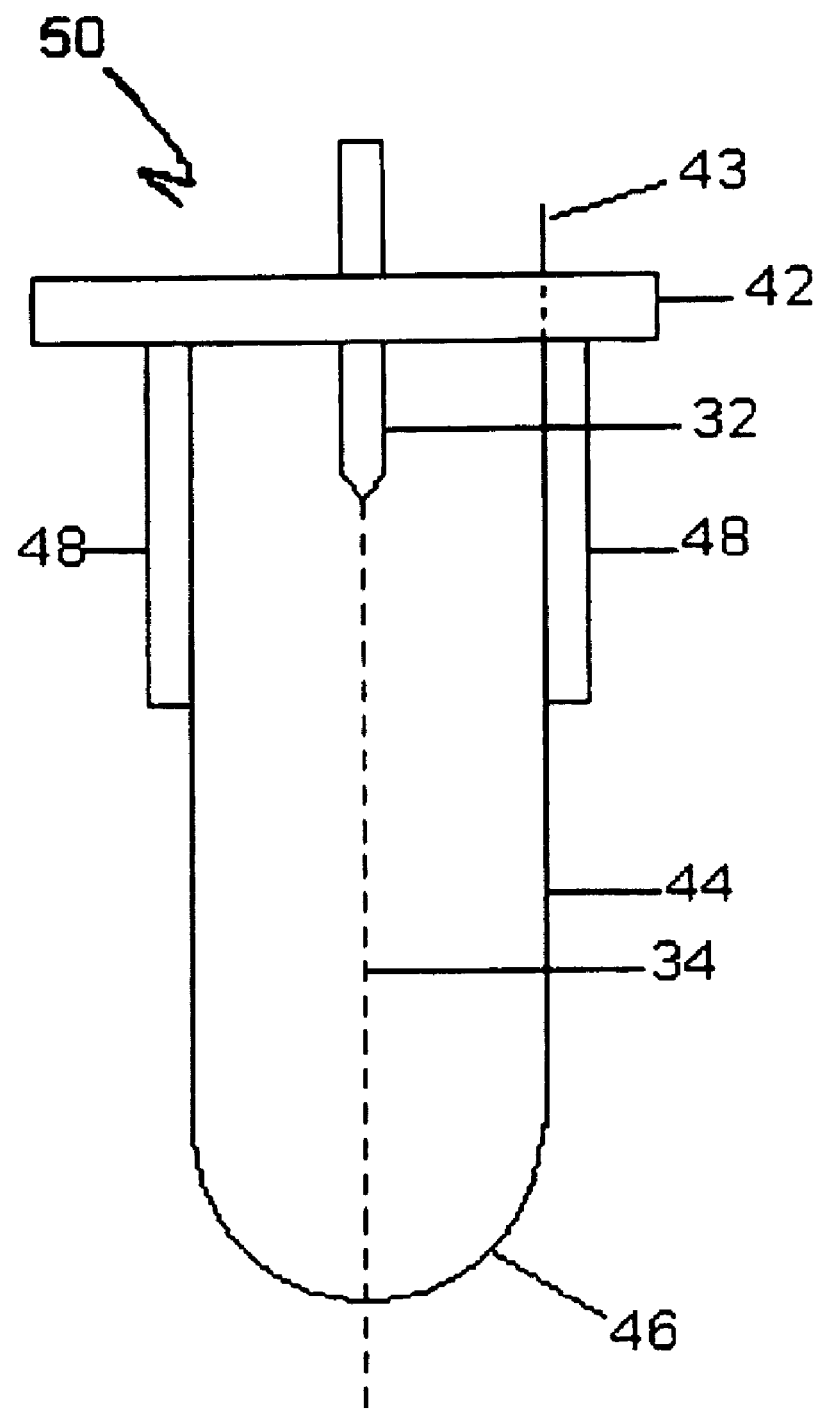
FIG. 2 is a schematic representation of an enclosed point source electron beam generator.

FIG. 2 illustrates another configuration of a tip assembly 50 in which tip 32 is in the shape of a carbon nanotube. In this embodiment, tip 32 has a relatively small diameter, in the range of 0.3 to 10 nanometers. In this embodiment, the carbon nanotube may be composed of single or multi-walled metallic-type carbon nanotube; alternatively, it may be composed of tungsten mono-atomic point emitter or other suitable material.

Referring again to FIG. 2, the tip 32 is preferably embedded in a support structure 42, which also serves as a thermal sink and ultra-high vacuum seal to a superconducting single walled metalic-type carbon nanotube 44 of relatively larger diameter (in the range, e.g., of approximately 5 to 200 nanometers), which also serves as a field emission extraction electrode and as a miniature ultra-high vacuum chamber. Electrical lead 43 passes through the support structure 42 to provide a means for creating an electrical potential difference between tip 32 and wall 44. In this embodiment, the electron beam 34 emerges from the field emitter 32 and is confined and focused by the superconducting nanotube 44. Since the momentum of the electrons in beam 34 is largely parallel to the wall 44, relatively little force is required to confine it within wall 44. This beam penetrates and emerges from the semispherical end cap 46. This end cap is less strongly superconducting, or may not be superconducting at all, than the rest of the carbon nanotube 44. Since the momentum of the electron beam 34 is perpendicular to the middle of end cap 46, the middle of end cap 46 serves as an electron window for certain material-dependent electron beam energies. An optional coating of material 48, which may optionally be superconducting, may be used for purposes of vacuum sealing, enhanced mechanical strength, or enhanced superconducting focusing of electron beam 34. In another embodiment (not shown), coating 48 may be connected to the electrical lead 43 and is then used as an electron extraction electrode, instead of nanotube 44.

Figure 3:
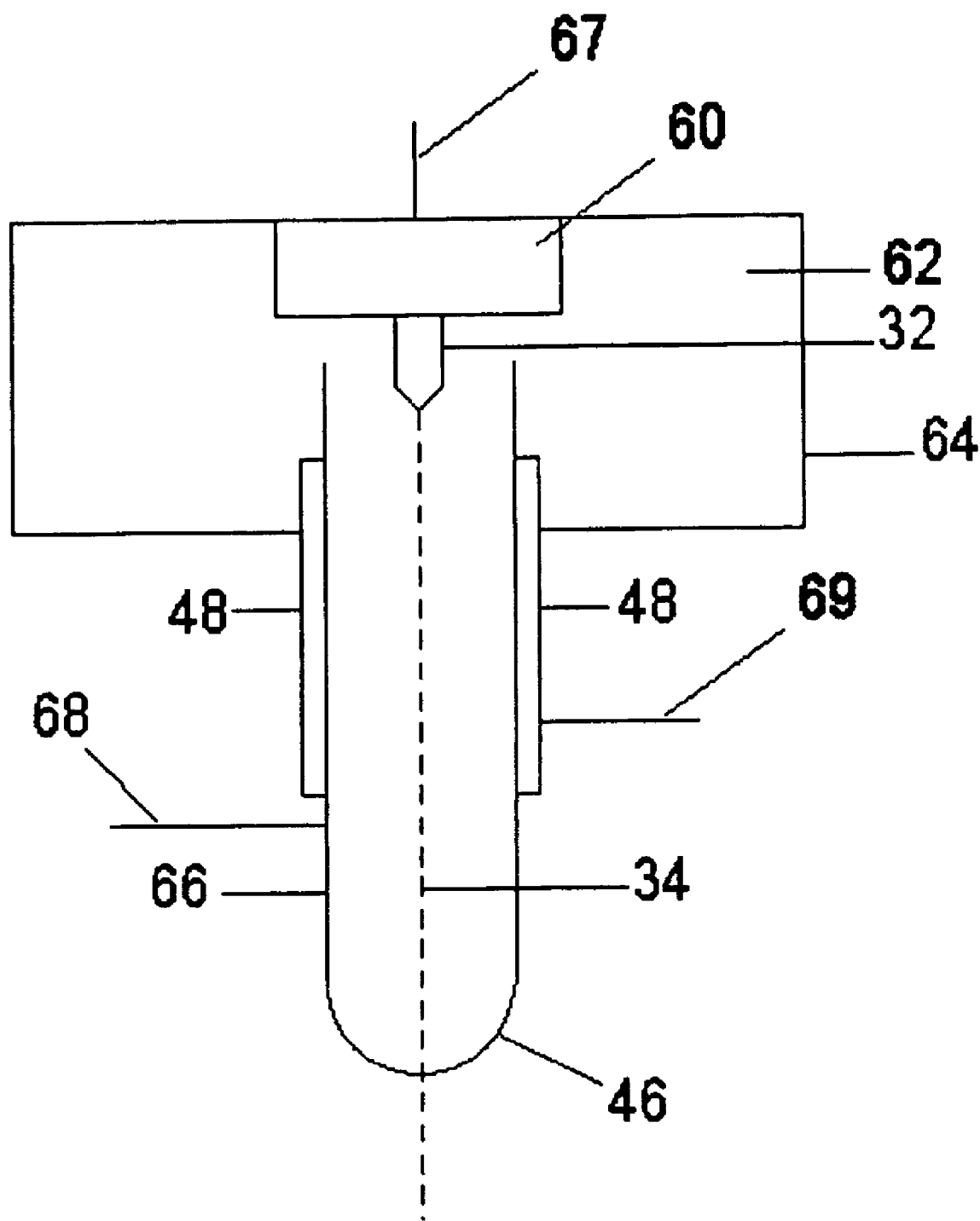
FIG. 3 is a schematic representation of an enclosed point source electron beam generator.

FIG. 3 illustrates another preferred embodiment of this invention. In this configuration, a fixed or dynamic emitter tip positioning system 60 is enclosed in a miniature ultra high vacuum chamber 62 and support structure 64. The tip 32 preferably has a relatively small diameter, e.g. in the range of approximately 0.3 to 10 nanometers; single walled metallic-type carbon nanotube 32 serves as an atomic point source field emitter of electrons 34. Alternatively, the atomic point source field emitter 32 may be a multi-walled carbon nanotube or a tungsten mono-atomic point emitter or other suitable material. This electron emitter 32 is embedded in a positioning system 60. The support structure 64 also serves as a thermal sink and ultra-high vacuum seal to a superconducting single walled metallic-type carbon nanotube 66 of relatively larger diameter, e.g. in the range of approximately 5 to 200 nanometers, which serves both as a field emission extraction electrode and as a miniature ultrahigh vacuum chamber.

The electron beam 34 emerges from the field emitter 32 and is confined and focused by the superconducting nanotube 66. The electron beam 34 penetrates the semispherical end cap 46 and emerges from the end of it. This end cap is less strongly superconducting or may not be superconducting at all. Since the momentum of the electron beam is perpendicular to the end cap 46 it serves as an electron window. An optional coating of material 48, optionally superconducting, may be used for purposes of vacuum sealing, enhanced mechanical strength, or enhanced superconducting focusing of the electron beam.

In the embodiment depicted in FIG. 3, electrical leads 67, 68 are connected to a voltage supply (not shown) which provides the electrical potential difference between the tip 32 and the field emission extraction electrode 66. Alternatively, an optional electrical lead 69 may be connected to a voltage supply (not shown) when the optional coating of material 48 is to be utilized as the field emission extraction electrode.

The relatively larger single walled carbon nanotubes in FIGS. 2 and 3 may be quite long compared to their diameter, e.g. on the order of a micron or more; in general, such nanotubes have aspect ratios of at least about 1:10 to 1:1000. The material properties (such as toughness and springiness of such nanotubes) may be adapted to allow the nanotubes to optionally be subjected to mechanical bending involving various high frequency resonant motion patterns, in the kilohertz through megahertz range, depending on specific geometry for purposes of directing, diverting, modulating, or scanning the emergent electron beam.

There are several forms of carbon nanotubes. In general, the most commonly studied forms of carbon nanotubes have physical properties such that they conduct electricity better than copper, they have a tensile strengths over 100 times that of steel, they become superconductors when cooled to extremely low temperatures, and they are exceptionally tough and resilient when subjected to mechanical bending.

The electron transparent structures illustrated in the Figures can be formed by the carbon nanotube end caps 46 shown in FIGS. 2 and 3. Alternatively, or additionally, these electron transparent structures may be replaced, in part or in whole, by mechanically attaching some other ultra thin film of suitably electron transparent material to the end of an uncapped carbon nanotube.

The micro-enclosed point source electron beam generators 10 of FIG. 1 and 32 of FIGS. 2 and 3 may be mechanically scanned near the target to be imaged or incorporated into the tip of an atomic force microscope for the purpose of very high resolution electron microscopy and spectroscopy; or such point source electron beam generators 10 of FIG. 1 and 32 of FIGS. 2 and 3 can be incorporated into an electron beam micro-column, such as described in "Fabrication of electron-beam microcolumn aligned by scanning tunneling microscope", Jeong-Young Park, et al, Journal of Vacuum Science and Technology A, Volume 15, Number 3, May/June 1997, 1499-1502.

Figure 21:
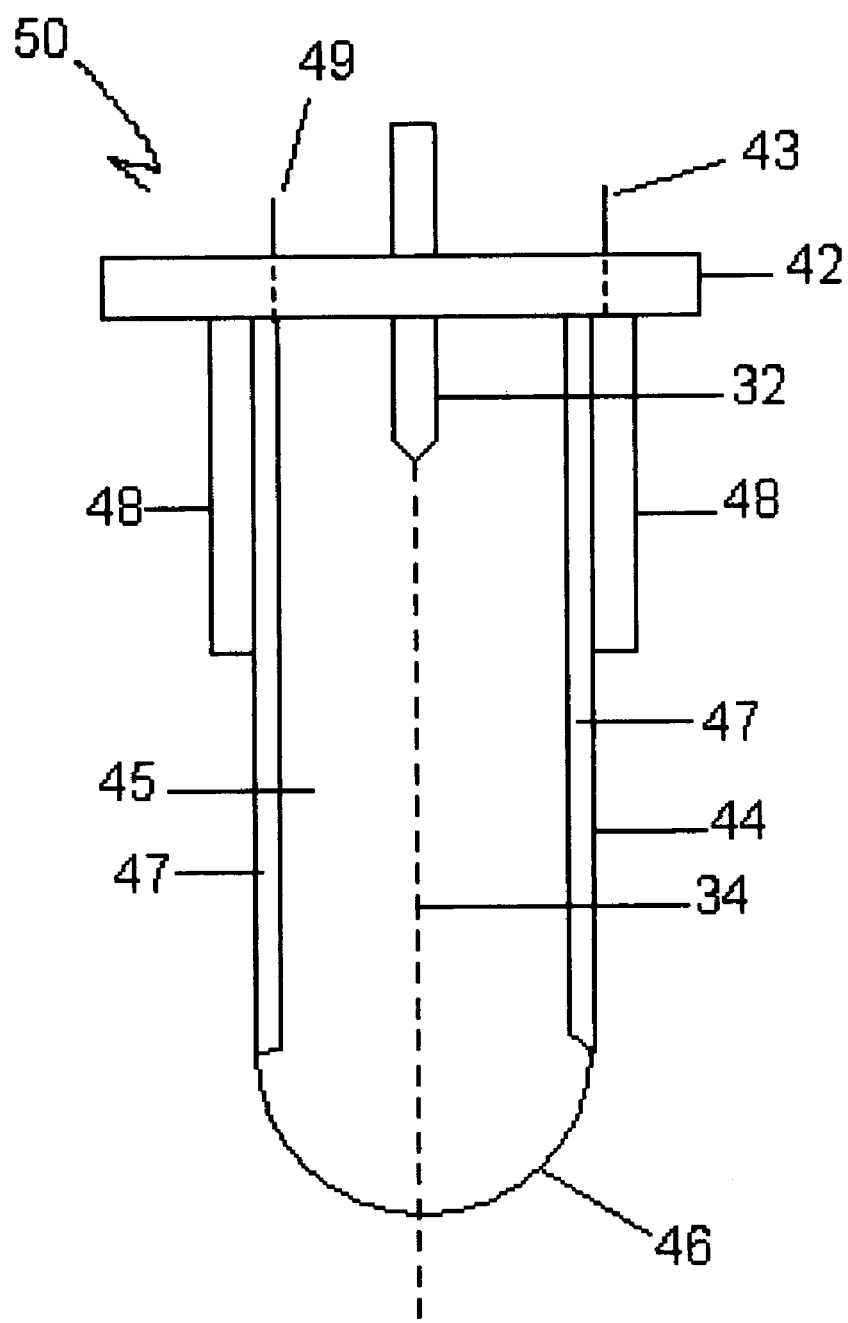
FIG. 21 is a schematic representation of another embodiment of an enclosed point source electron beam generator.

FIG. 21 is a schematic representation of another embodiment of an enclosed point source electron beam generator. Referring to FIG. 21, and in the preferred embodiment depicted therein, there is illustrated another configuration of a tip assembly 50 in which tip 32 is in the shape of carbon nanotube. In this embodiment, tip 32 has a relatively small diameter, in the range of 0.3 to 10 nanometers. In this embodiment, the carbon nanotube may be composed of single or multi-walled metallic-type carbon nanotube; alternatively, it may be composed of tungsten mono-atomic point emitter or other suitable material. Referring again to FIG. 10, the tip 32 is preferably embedded in a support structure 42, which also serves as a thermal sink and ultrahigh vacuum seal to a superconducting single walled metallic-type carbon nanotube 44 of relatively larger diameter (in the range, e.g., of approximately 5 to 200 nanometers), which also serves as a field emission extraction electrode and as a miniature ultrahigh vacuum chamber. Electrical lead 43 passes through the support structure 42 to provide a means for creating an electrical potential difference between tip 32 and wall 44. In this embodiment, the electron beam 34 emerges from the field emitter 32 and is confined and focused by the superconducting nanotube 44. Since the momentum of the electrons in beam 34 is largely parallel to the wall 44, relatively little force is required to confine it within wall 44. This beam penetrates and emerges from the semispherical end cap 46. This end cap is less strongly superconducting, or may not be superconducting at all, than the rest of the carbon nanotube 44. Since the momentum of the electron beam 34 is perpendicular to the middle of end cap 46, the middle of end cap 46 serves as an electron window for certain material-dependent electron beam energies. An optional coating of material 48, which may optionally be superconducting may be used for purposes of vacuum sealing, enhanced mechanical strength, or enhanced superconducting forcing of electron beam 34. In another embodiment (not shown), coating 48 may be connected to the electrical lead 43 and is then used as an electron extraction electrode, instead of nanotube 44.

In this preferred embodiment, a very thin film coating 47 comprising a conducting material, e.g. silver, copper, titanium, gold, etc. is applied to the inner surface of superconducting nanotube 44. The conductivity of thin film coating 47 is relatively small in comparison to the conductivity of superconducting nanotube 44. As such, thin film 47 is "magnetically invisible" to electron beam 34. Thin film coating 47 has sufficient magnetic strength, however, to remove low energy, off axis electrons from electron beam 34. Concurrently, thin film coating 47 geometrically reduces the average effective vacuum tunneling gap, (which is the distance from a beam particle to a conductor) of superconducting nanotube 44, thus keeping electron beam 34 highly coherent and focused. Connector 49 is connected to a power supply (not shown), which provides an electrical potential to thin film coating 47.

Figure 22:
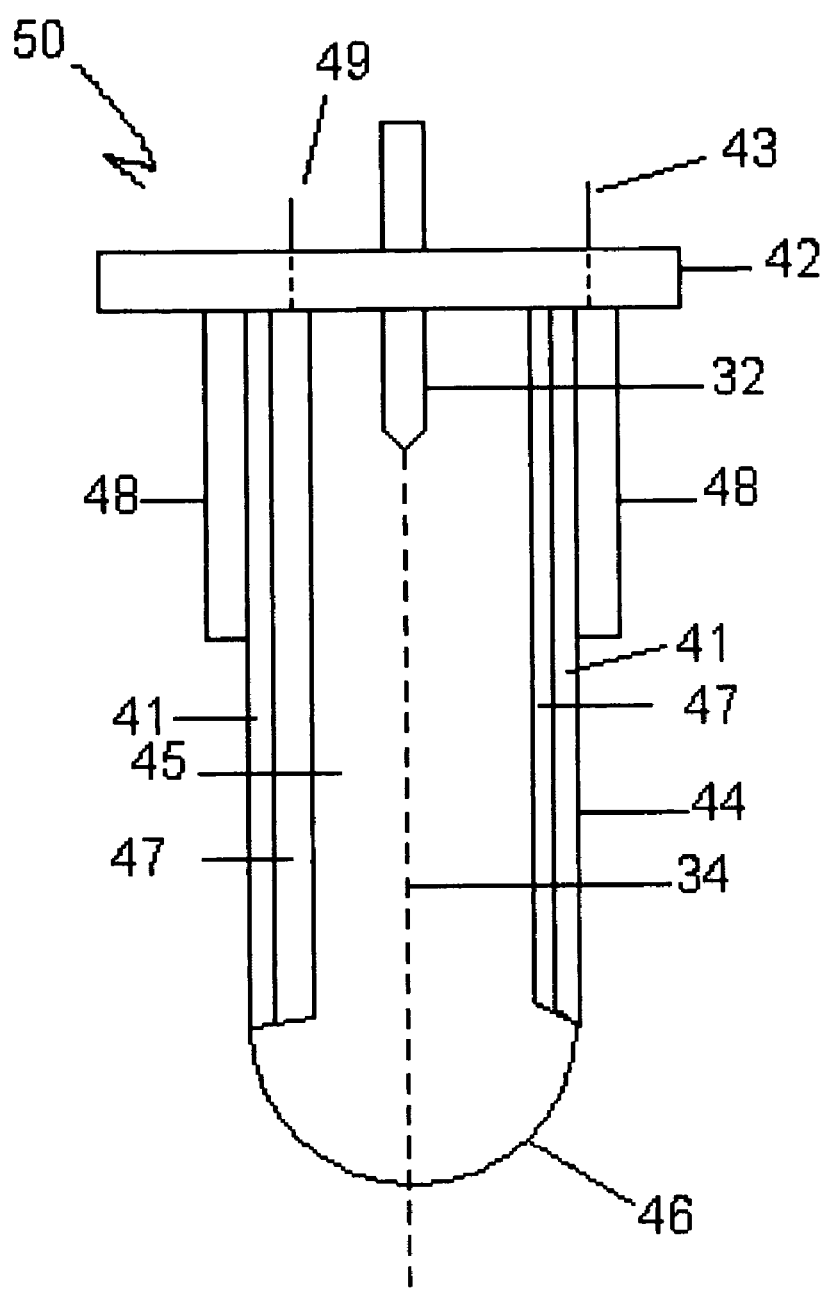
FIG. 22 is a schematic representation of another embodiment of an enclosed point source electron beam generator.

FIG. 22 illustrates another preferred embodiment of this invention. In this embodiment, a thin; insulating film 41 is disposed between the inner surface of superconducting nanotube 44 and conductive thin film coating 47.

Figure 23:
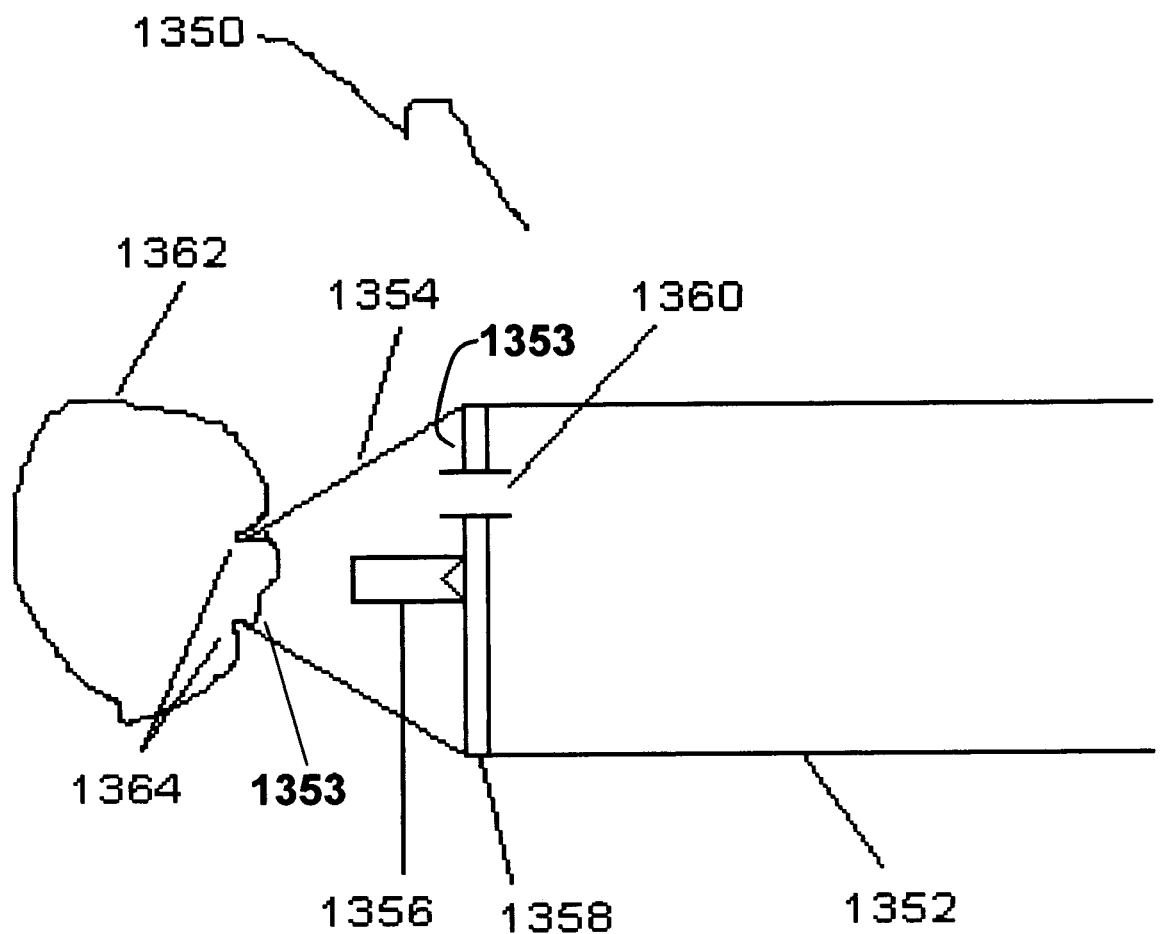
FIG. 23 is a schematic representation of an enclosed pico-SEM (Scanning Electron Microscope) comprising an enclosed point source electron beam generator.

FIG. 23 is a schematic representation of an enclosed pico-SEM (Scanning Electron Microscope) comprising a carbon nanotube point source of electrons, which may be comprised of any of the systems shown in FIGS. 1, 2, 3, 21 or 22 and previously described in this specification. Miniature pico-SEM having working distances less than the mean free path for air, and can operate at low to medium vacuum. Referring to FIG. 23, device 1350 comprises an enclosed point source electron beam generator 1356, which is preferably a carbon nanotube point source of electrons previously described in this specification.

Device 1350 may be used to scan external and internal cell membranes and embedded, non-channel molecular structures, microtubule surfaces and other biological features of interest in their native state. Device 1350 further comprises a conically tapered enclosure 1354 having a proximal end 1353 and a distal end 1355. The proximal end of conical tapered enclosure 1354 is attached to a vacuum tube 1352 through supporting member 1358. Supporting member 1358 has an opening 1360, which provides a connection to vacuum tube 1352. The distal end 1355 of conically tapered enclosure 1354 comprises conical pipette tip target opening 1364 having a diameter ranging from about 10 nanometers to about 300 nanometers. Conical pipette tip target opening 1364 is coated with a watertight sealant. Device 1350 may be steered into position so that opening 1364 may become in contact with surface 1362 of specimen to be scanned by pico-SEM 1356. A portion of surface 1362 may extend into the conically tapered enclosure 1354 through opening 1364 by capillary action. The pressure inside conically tapered enclosure 1354 may be regulated by varying the pressure inside vacuum tube 1352 to counteract the capillary action. The distance from pico-SEM 1356 to surface 1362 may be adjusted by varying the backpressure provided by vacuum tube 1352.

Figure 4:
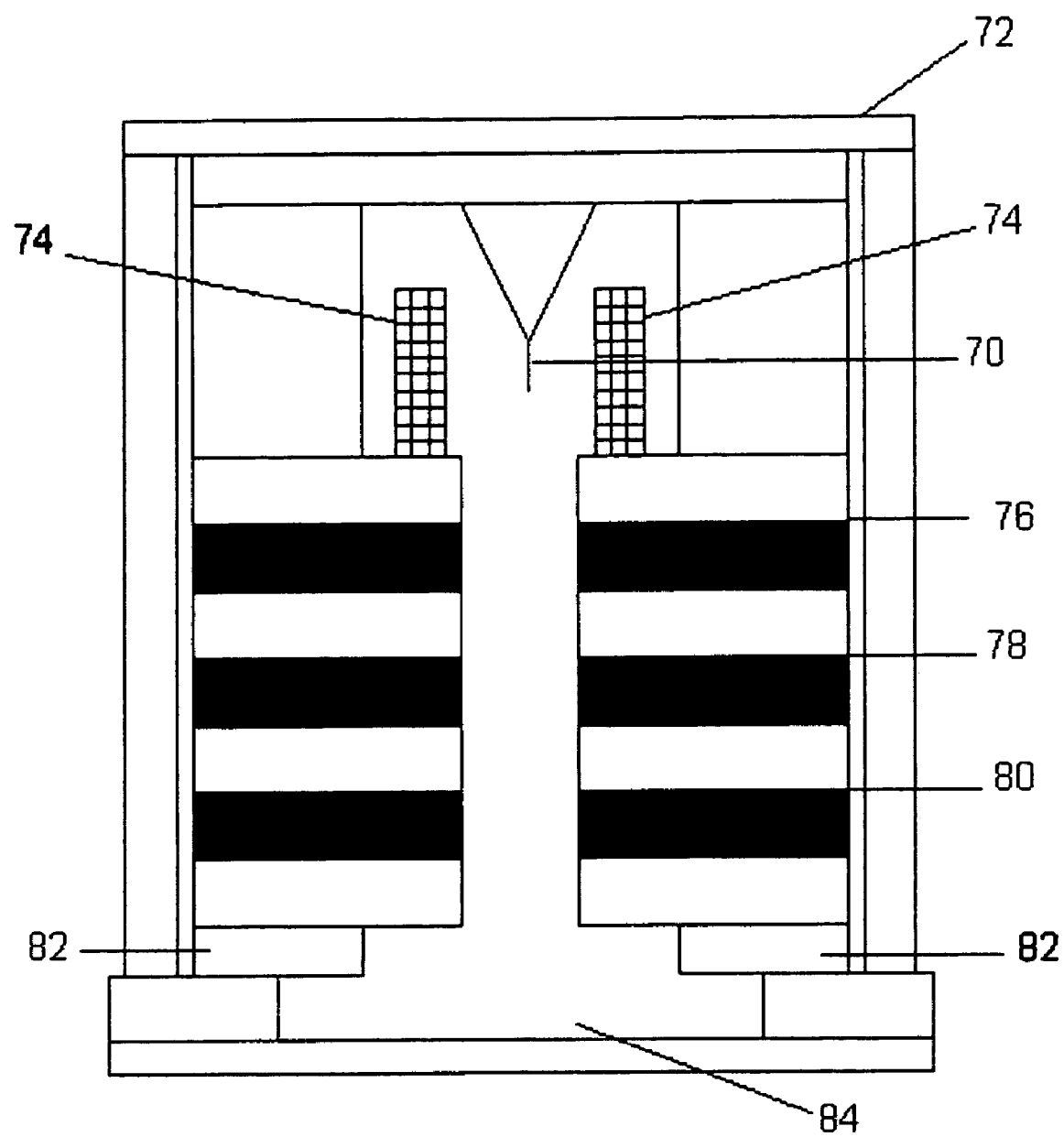
FIG. 4 is a schematic representation of a miniature scanning electron microscope using an enclosed point source electron beam generator.

FIG. 4 illustrates the use of a micro-enclosed point source of electrons 70, (which may consist of any of the systems shown in FIGS. 1, 2, and 3) to substantially improve on other devices, such as, e.g., the device disclosed in Thomas George's "Miniature Electron Microscopes Without Vacuum Pumps", NASA Technical Brief, Vol. 22, No. 8. (JPL NEW TECHNOLOGY REPORT NPO-20335). A low-to-medium vacuum enclosure 72 contains the whole system; in general, the pressure within enclosure 72 is from about $10^{-3}$ to $10^{-6}$ Torr. An optional superconducting cylinder 74 can be used for narrowing the conical emerging electron beam. An optional beam extraction electrode and/or beam acceleration or deceleration electrodes 76 may be used. Electrode pair 78 and electrode 80 are used for scan deflection and focus. Backscattered electron detectors 82 are placed above the observation and manipulation stage 84. Secondary and backscattered electrons may be detected either by a micro channel plate, or a channeltron, or by other conventional means.

Figure 5:
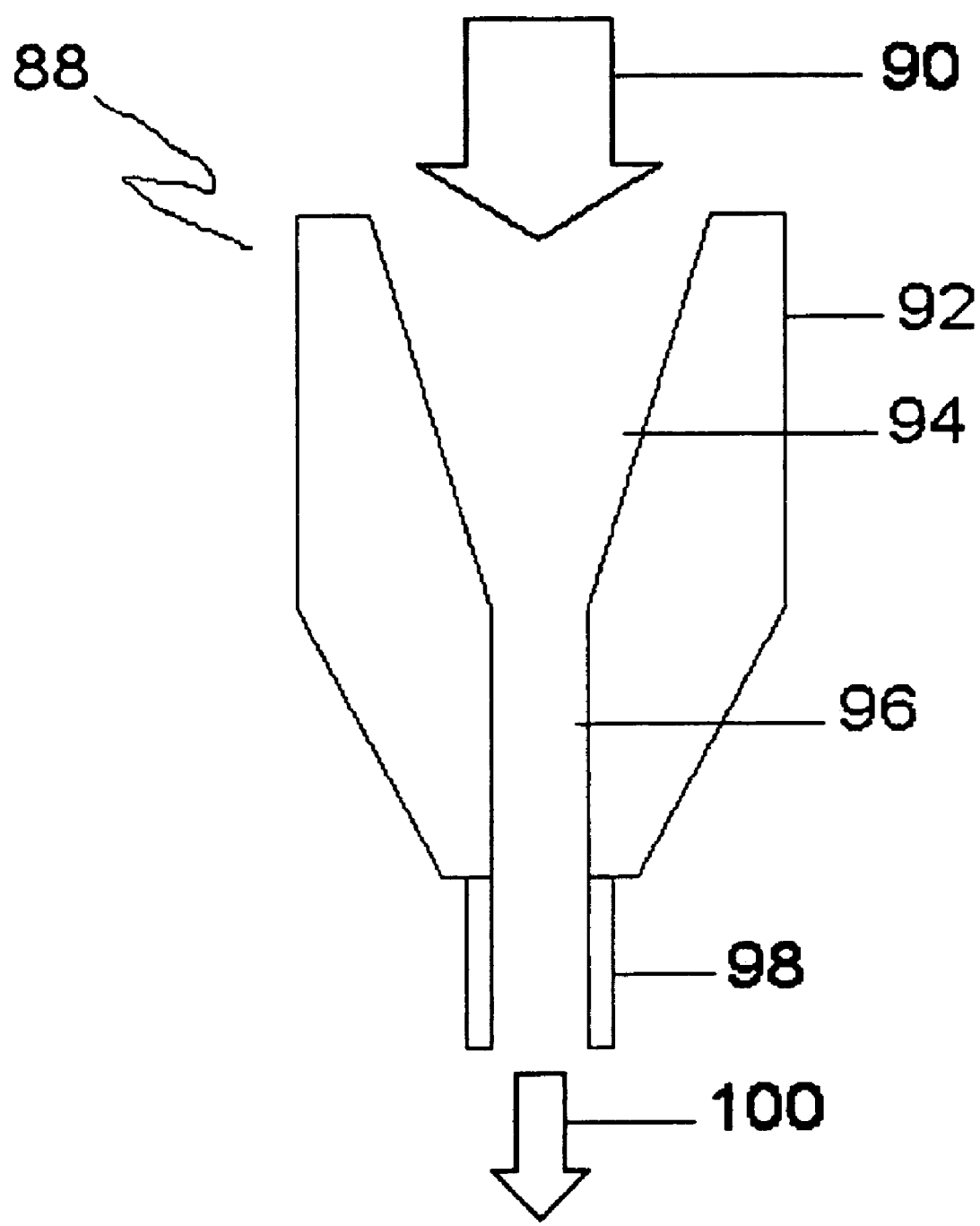
FIG. 5 is a schematic representation of an electron beam focusing coupler for a superconducting nano-channel.

The use of superconducting channels for manipulating electron beams has been described in "High Tc bulk superconductor wigglers", Hidenori Matsuzawa, et al, Applied Physics Letters, Volume 59, Number 2, 8 Jul. 1991, 141-142. FIG. 5 shows how a relatively large (in the range of approximately 0.1 to 100 micron diameter) beam of electrons or positive ions 90 may be narrowed into a beam 100 by means of a superconducting channel assembly 88. Beam 90 passes through superconducting material 92 with a converging funnel channel 94 to a channel 96 of dimensions in the range of approximately 1 to 100 nanometer diameter, and through a connected single walled superconducting carbon nanotube 98. The superconducting structure 92 may optionally be split in planes perpendicular to the funnel 10 axis into several mutually insulating segments that are mutually electrified so as to facilitate the attraction of electrons into each successive segment.

Figure 6:
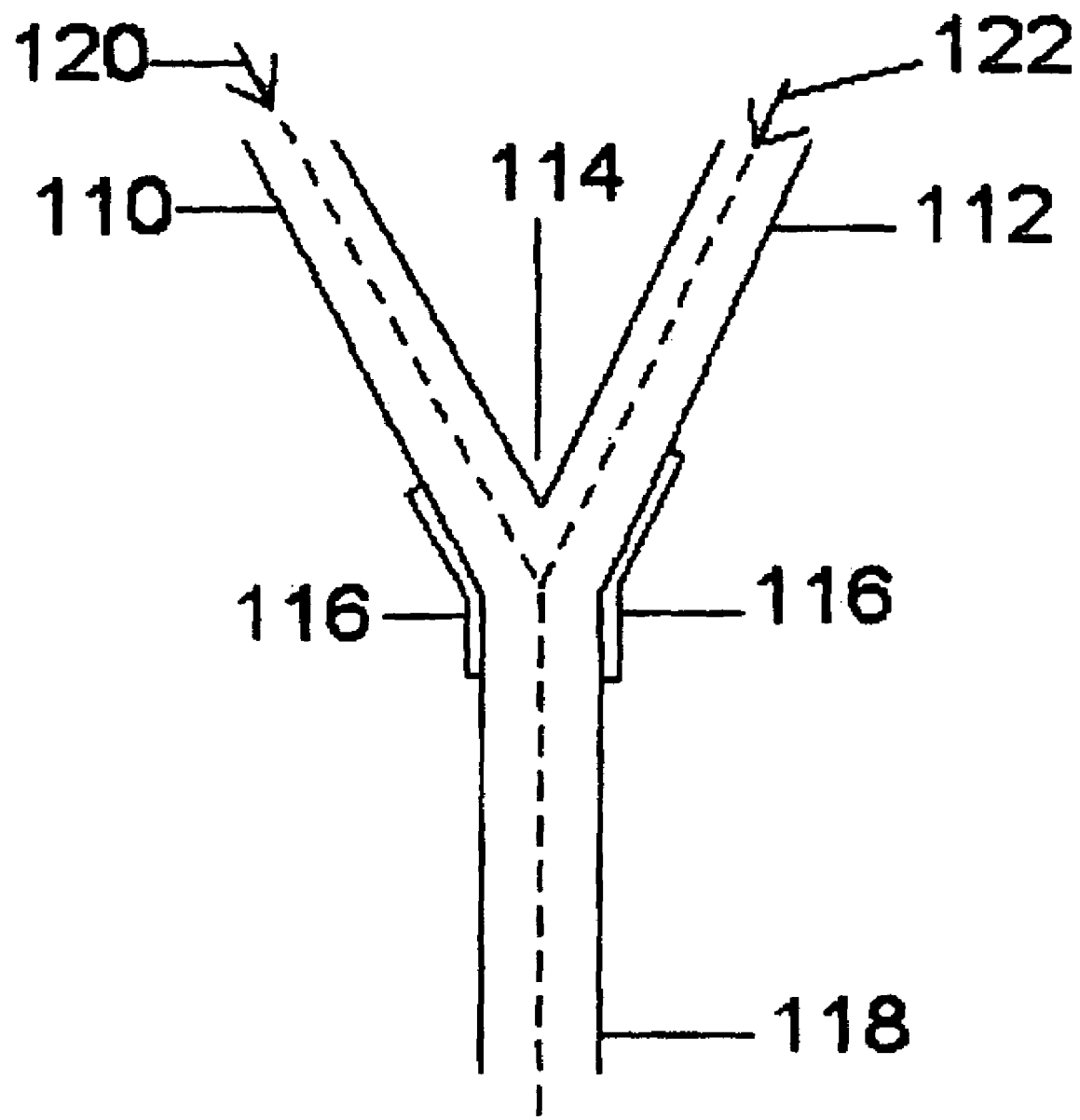
FIG. 6 is a schematic representation of a superconducting nano-channel Y junction.

FIG. 6 illustrates the use of superconducting carbon nanotubes 110, 112 in the range of about 0.3 to 100 nanometers in diameter constructed into a Y-junction 114. Because superconductivity is likely substantially reduced in the junction region itself, this region would normally be externally coated with a thin film of superconducting material 116. The more general use of high temperature superconductors for such coatings and the coating of all channels removes the requirement that the carbon nanotubes be superconducting or be used at the temperature at which they are superconducting. This system can be used to couple an electron beam 120 with an ion beam 122 or with another source of electrons at a different energy level, from inlets 110, 112 into the Y-junction 114 and to the single coaxial outlet 118. One of several means of using such a system is to use the electron beam for target illumination and positioning purposes, and using the ion beam for transient milling or ion deposition purposes.

Figure 7:
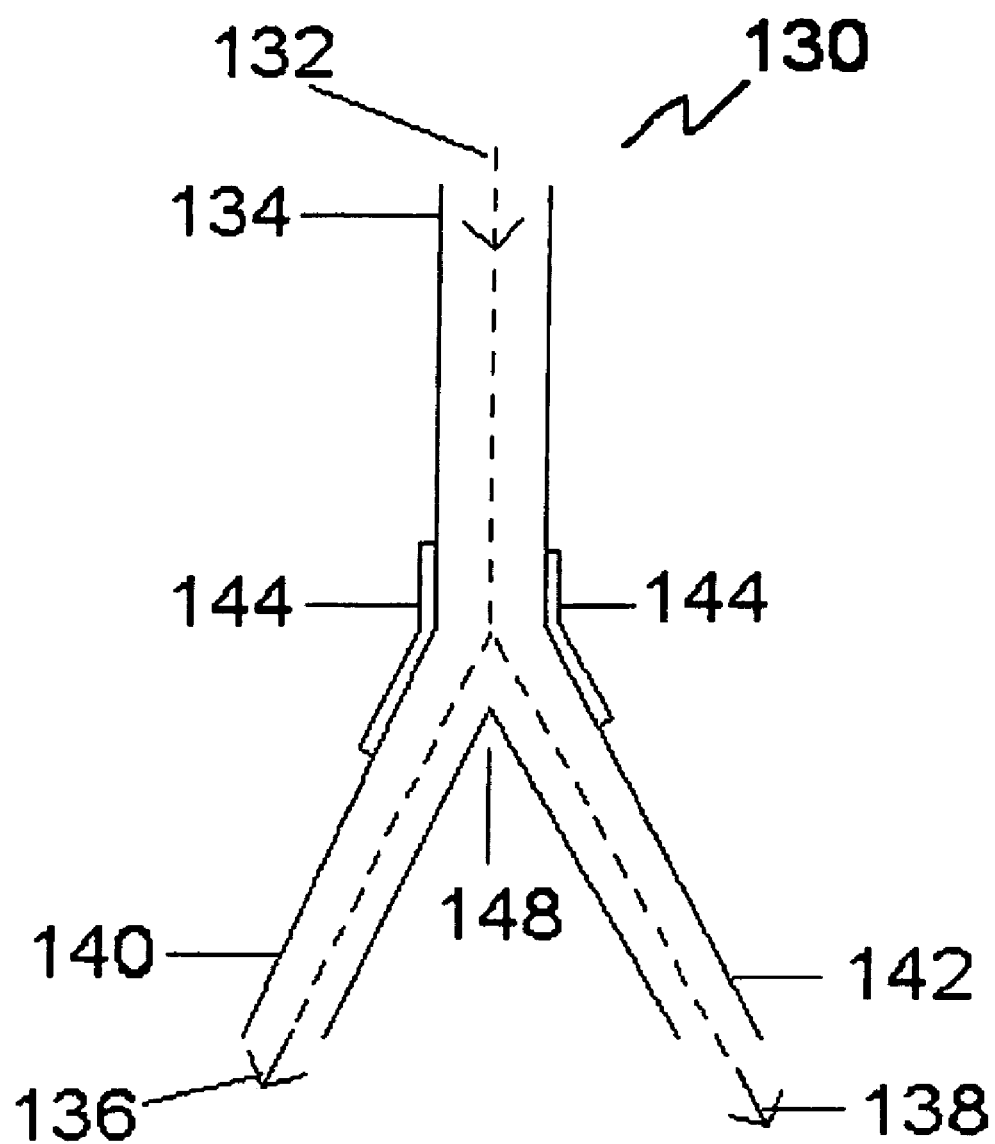
FIG. 7 is a schematic representation of a superconducting nano-channel Y junction.

Alternatively, the Y-junction assembly 130 shown in FIG. 7 can be used to split an electron beam 132 entering inlet 134 into 2 beams 136, 138 exiting at outlets 140, 142. Additional thin film coating 144 of a superconducting material may optionally be employed to enhance the superconducting property at the junction 148. Such junctions need not be symmetric in branching angles or in terms of nanotube diameters. Multiple such splitting and merging junctions may be combined in practice, and may be structured so as to implement nano-scale electron beam analogs of fluidic technology, including feedback loops.

Modulation mechanisms may be provided by external pulsed magnetic fields above the local superconducting shielding level, induction of trapped magnetic fields inside and along the axis of nano-channel loops, locally induced transient thermal excursions above the superconducting threshold temperature, mechanical bending, and the use of electrically insulated superconducting channel segments at differing potentials. These can be used in vacuum electronic device systems that dispense with individual solid state cathodes and individual solid state anodes. Such systems can also be realized without using carbon nanotubes, by exploiting the fabrication techniques that are used for micro-electro-mechanical systems. Such device systems can implement analog and digital types of transducer, signal processing, and computing functions. The highly modulated electron beam output of such systems can be used for subsequently miniaturized electron microscopy implementation, and for corollary use in spatially resolved electrochemistry processes.

Figure 8:
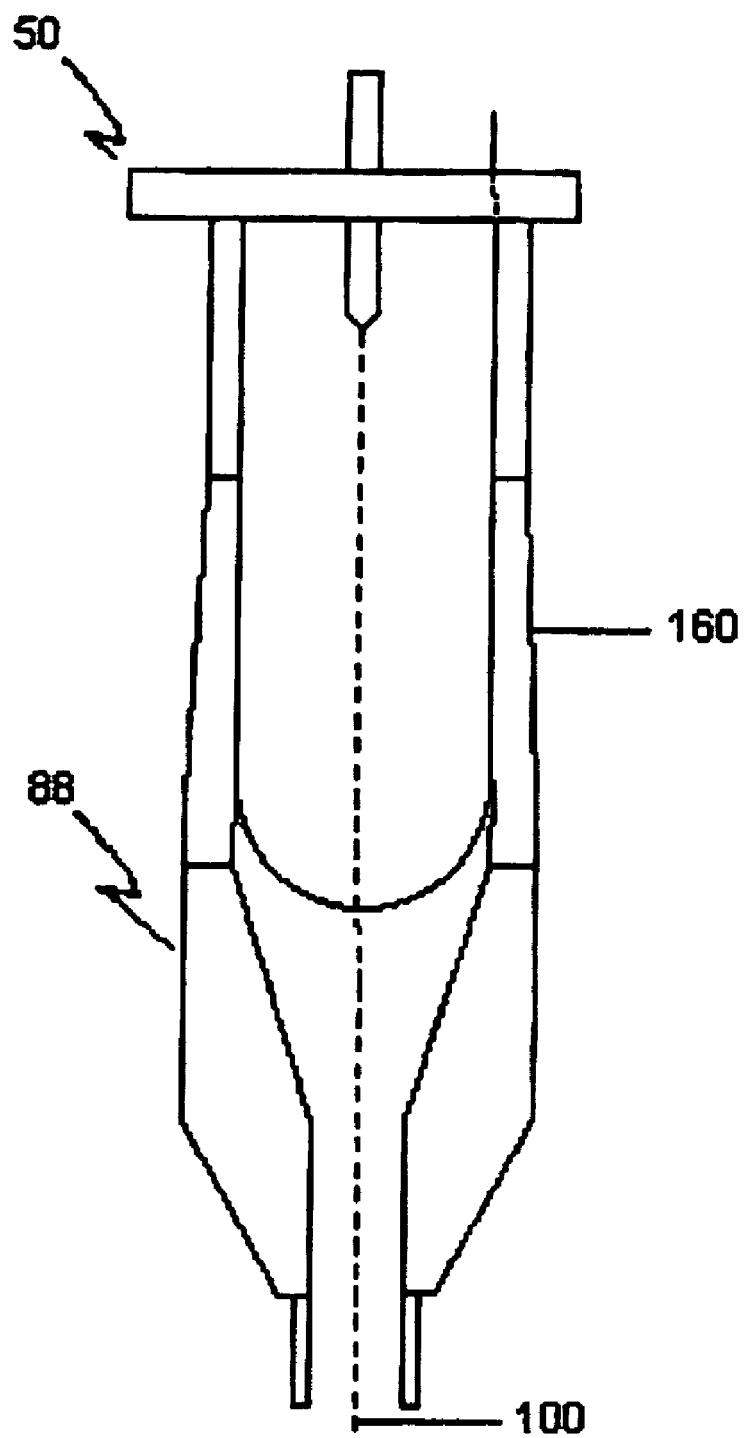
FIG. 8 is a schematic representation of a point source electron beam generator coupled to an electron beam focusing superconducting nano-channel.

FIG. 8 illustrates one preferred use of the electron beam emitter assembly 50 of FIG. 2 together with the superconducting channel assemble 88 of FIG. 5. A material 160 is used to attach assembly 50 to the assembly 88. In one embodiment, material 160 is a non-conducting material, e.g. Nylon-6, Nylon-66, Teflon or the like, and electrically isolates assembly 50 from assembly 88. In another embodiment, material 160 is a superconducting material.

The ability to generate, guide and manipulate electron beams or other charged particle is an essential feature of microscopy devices, such as e.g., Scanning Tunneling Microscopes (STM) and Atomic Force Microscopes (AFM). The superconducting nano-channel structures of this invention, comprising carbon-based nanotubes, may be used with microscopy probes. They may also operate with a miniature ultra-high vacuum enclosure with an electron-transparent widow.

Free standing flexible superconducting nanometer scale tubes and fixed superconducting nanometer scale channels formed on supporting substrates, manufactured by means well known to those skilled in the art of micro-lithography and related micro-fabrication techniques, may be further used for conveying coherent electron beams with energies corresponding to wavelengths of a similar order of magnitude (e.g. a few electron volts) and provides a nanometer scale electron beam analog of micron scale fiber optical systems.

Figure 9:
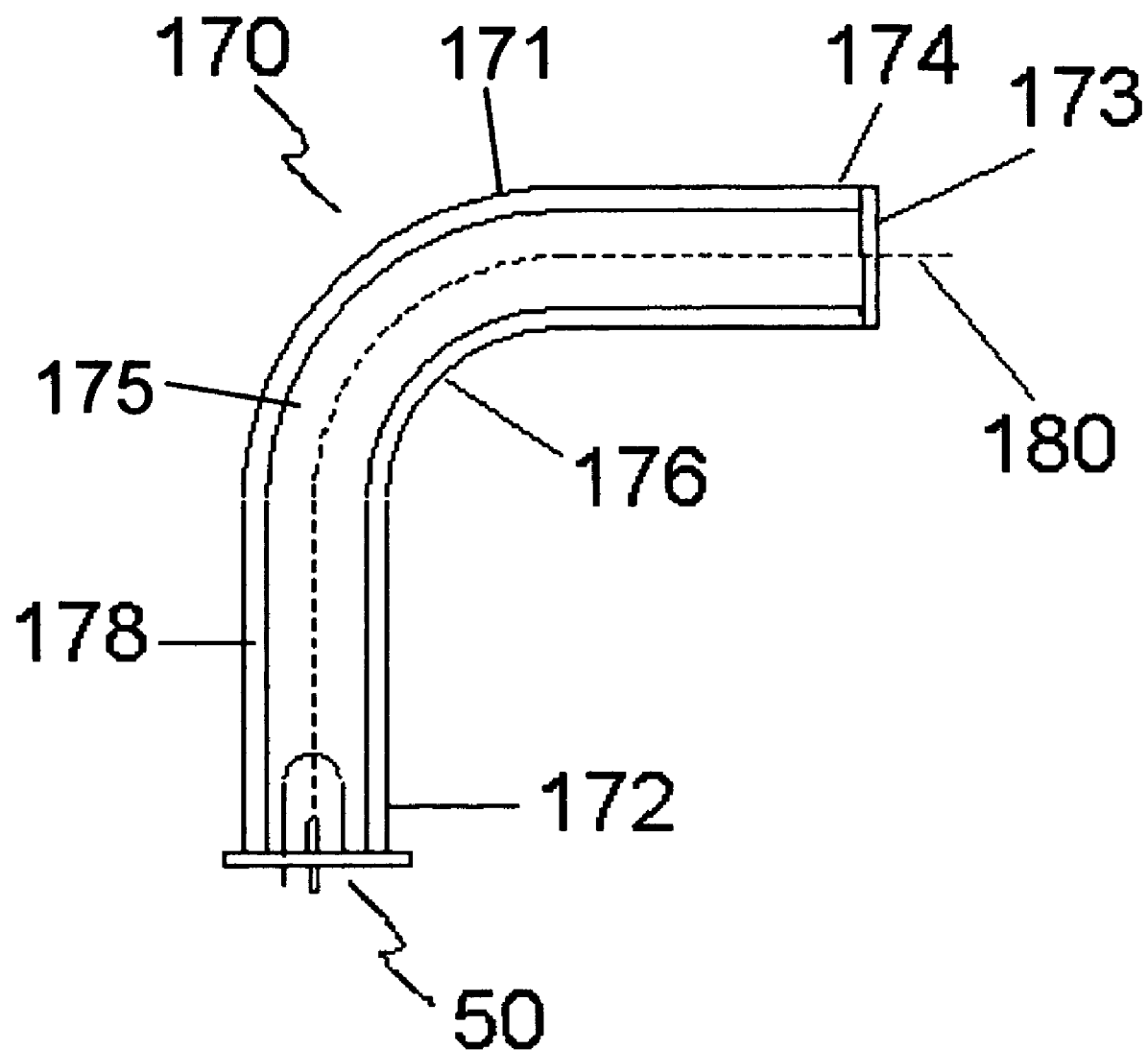
FIG. 9 is a schematic representation of one embodiment of a device for guiding charged particle beams comprising a superconducting nano-channel.

FIG. 9 is a schematic representation of one embodiment of a device for guiding charged particle beams comprising a superconducting nano-channel. Referring to FIG. 9, device 170 comprises a superconducting channel 171 consisting essentially of a superconducting material 178 in the form of a tube, for guiding electron beam or other charged particle beam 180. In the embodiment depicted in FIG. 9, beam 180 passes through an approximately 90 degree bend 176 in the channel 171 and exits at the channel distal end 174. In other embodiments, bend 176 may be constructed with a structure having an arc of other than 90 degrees. Bend 176 is preferably greater than zero degrees, and as much as 180 degrees in an embodiment wherein the direction of the particle beam 180 is to be substantially reversed.

In a further embodiment, charged particle beam guiding device 170 is an apparatus for generating and guiding a charged particle beam. Referring again to FIG. 9, apparatus 170 comprises a point source particle beam generator coupled to a superconducting nano-channel, the end thereof being sealed with an electron beam transparent membrane. FIG. 9 illustrates a preferred embodiment in which electron beam emitter assembly 50 is coupled to superconducting channel 171 for conveyance of coherent electron beam 180. At the proximal end 172 of channel 171 is attached electron source 50. An electron transparent window 173 is sealed to channel end 174 to form an ultra-high vacuum region 175 through which electron beam 180 travels. Because of the nano-scale dimensions of superconducting channel 171, ultra-high vacuum conditions may be achieved within region 175.

It will be apparent that any of the enclosed point source electron beam generators previously described and shown in FIG. 1, 2, or 3 will be suitable for electron source 50. It will be further apparent that electron transparent membrane or window 173 may be either substantially planar, or a semi-spherical cap, and of the materials previously described in this specification and shown in FIGS. 1, 2, and 3.

Figure 10A:
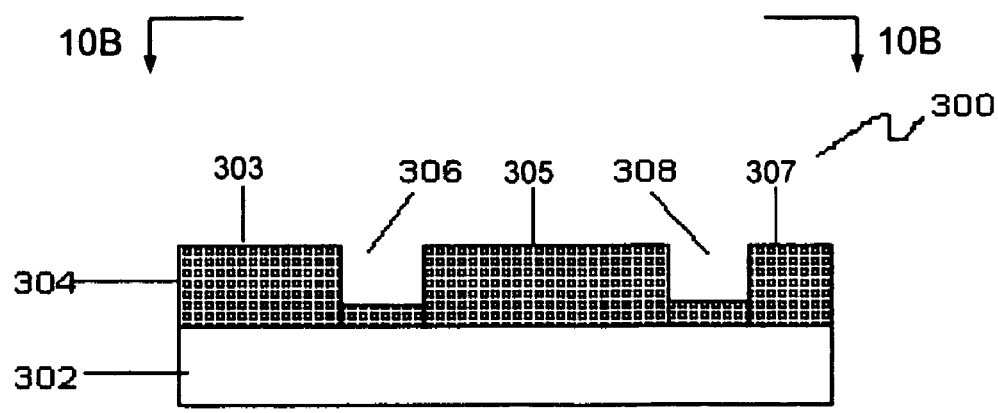
FIG. 10A is a schematic representation of a side view of a superconducting nano-channel network.
Figure 10B:
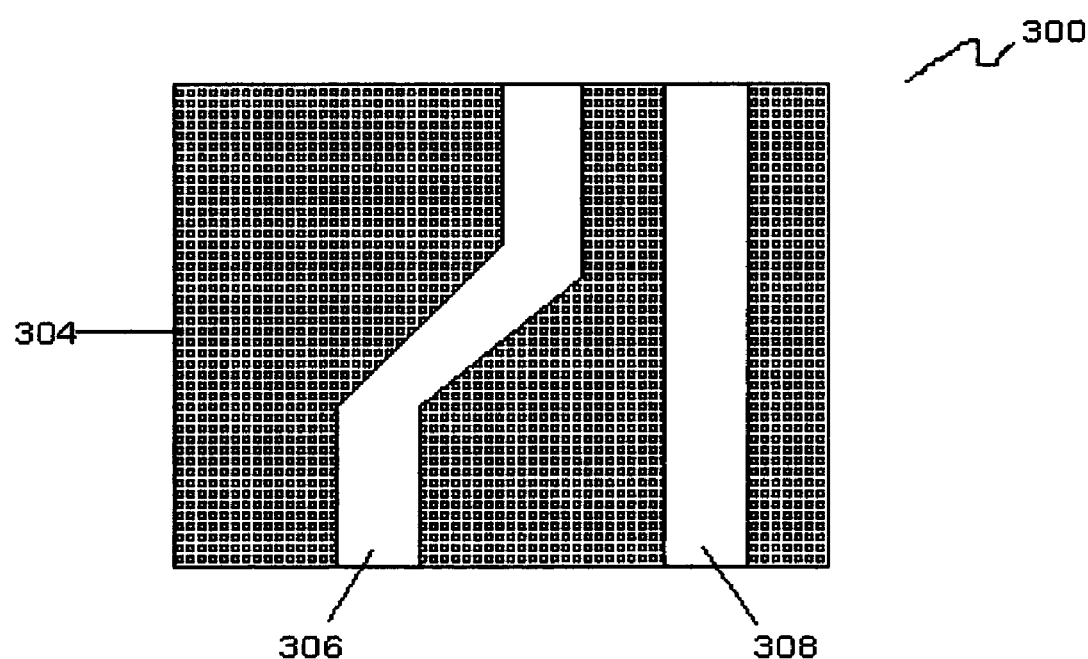
FIG. 10B is a top view of the representation of FIG. 10A taken along line 10B-10B of FIG. 10A.

FIG. 10A is a schematic representation of a side view of a superconducting nano-channel network, and FIG. 10B is a top view of the representation of FIG. 10A taken along line 10B-10B of FIG. 10A. FIGS. 10A and 10B illustrate a preferred embodiment in which 2-D, "2.5-D", and 3-D superconducting nano-channels may be fabricated on a substrate using lithographic or stereo-lithographic means.

Referring to FIGS. 10A and 10B, assembly 300 comprises substrate 302 onto which superconducting material 304 is deposited by means known in the art. Superconducting nano-channels 306 and 308 may be formed using lithography or stereo-lithography, or other suitable micro-fabrication means, wherein areas 303, 305, and 307 of material 304 have edges substantially parallel to each other, thereby forming channels 306 and 308. In one embodiment, additional layers of superconducting material (not shown) may be deposited on top of superconducting material 304 to completely enclose channels 306 and 308, and to provide additional channels (not shown), thus forming a complex network of superconducting channels. Electron beams or other charged particles may be guided and manipulated through the network of superconducting channels taking advantage of the Meissner effect of superconductors (repulsion forces). Layers of insulating material (not shown) may be deposited so that the complex network of superconducting nano-channels may be segmented into sections held at different electrical potentials by one or more power sources (not shown). Superconducting material 304 may comprise C60 hybrids or boron nitride. Superconducting nano-channel networks may be combined with conventional integrated circuit technology to fabricate integrated (nano and pico-beam) vacuum nano-electronic devices (both digital and analog). These devices may be used to generate and modulate nano and pico-electron beams for high-resolution imaging, or for gathering and processing information obtained from detectors and transducers.

It will be apparent that although a two dimensional embodiment is depicted in FIGS. 10A and 10B, three dimensional embodiments may be readily fabricated wherein the substrate 302 has a three dimensional topography.

Figure 11A:
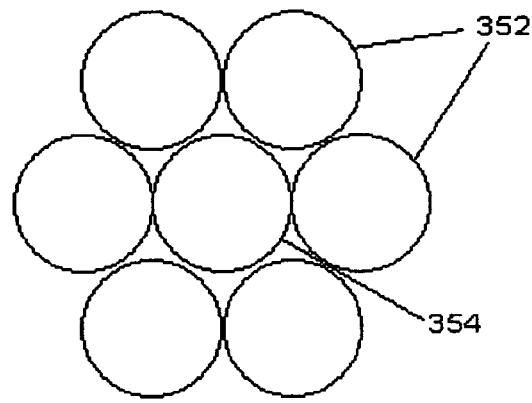
FIGS. 11A, 11B, and 11C are schematic representations of embodiments of superconducting nano-channels having nano-scale superconducting rods.
Figure 11B:
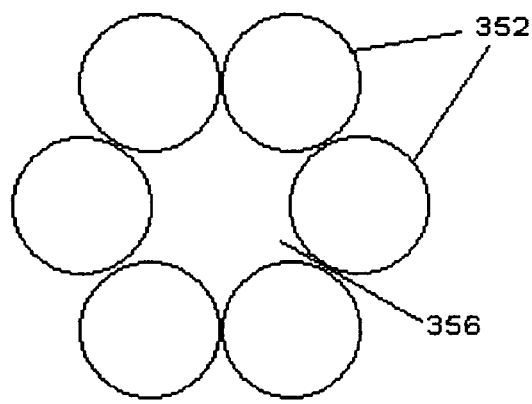
Figure 11C:
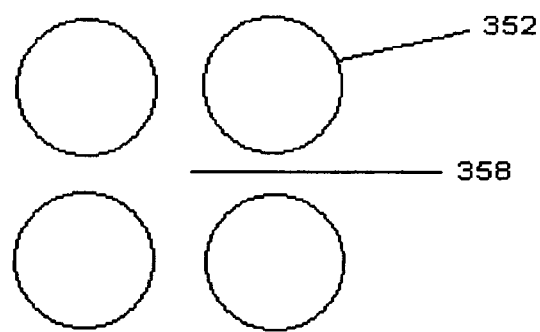

FIGS. 11A, 11B, and 11C are schematic representations of embodiments of superconducting nano-channels having nano-scale superconducting rods. FIGS. 11A, 11B, and 11C illustrate preferred embodiments in which a superconducting nano-channel suitable for guiding and manipulating sub-nanometer-scale electron beams and other charged particles may be formed by geometrically arranging nano-scale superconducting rods or wires around a central region.

Referring to FIG. 11A, and in the embodiment depicted therein, rods 352 are provided with a substantially circular cross section. Rods 352 are arranged in physical contact with one another, around center rod 354. Referring to FIG. 11B, central rod 354 is removed to form a central superconducting nano-channel 356 bounded by superconducting rods 352. Electron beams or other charged particles may flow through channel 356.

Referring to FIG. 11C, in an alternate embodiment comprising four rods 352, superconducting rods 352 arranged around central superconducting nano-channel 358, through which electron beams or other charged particles may flow. In the embodiment depicted in FIG. 11C, superconducting rods 352 are not in physical contact with one another. It is to be understood, that superconducting rods 352 may have cross sections other than a circular one. It is also to be understood that superconducting rods 352 may not be continuously straight along their length, they may or may not be solid in cross section, and may or may not be held at the same electrical potential by one or more power source (not shown) unless they are in electrical contact. Superconducting rods 352 may be coated with conductive material (not shown). Any suitable scaffold or similar device, many of which are known to those skilled in the art, may be used to hold superconducting rods 352 together.

Figure 12:
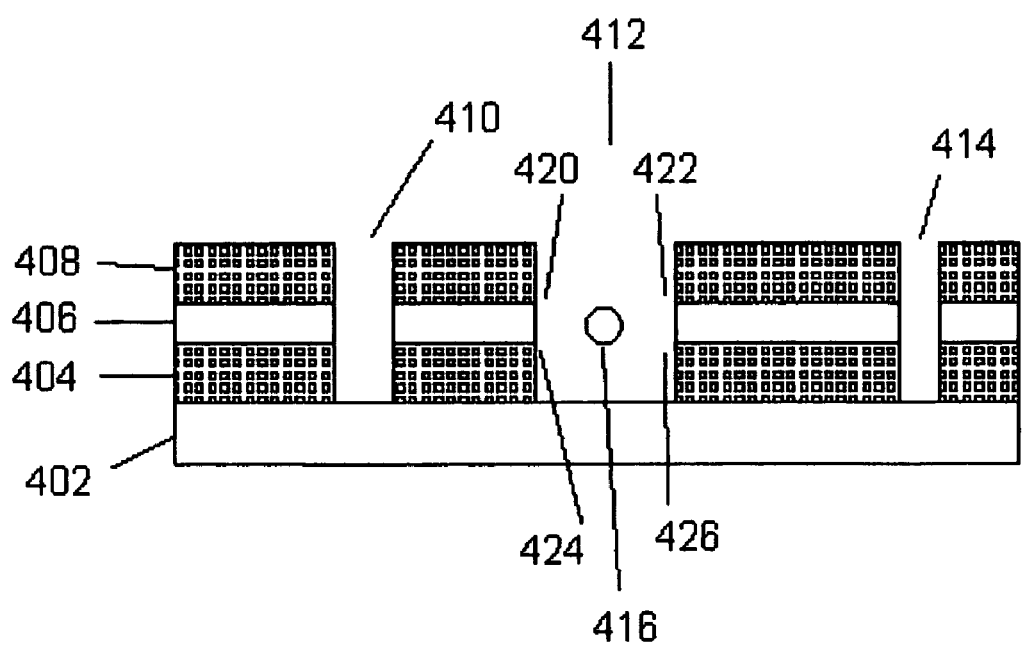
FIG. 12 is a schematic representation of a superconducting nano-channel having multiple layers.

FIG. 12 is a schematic representation of a superconducting nano-channel having multiple layers. FIG. 12 illustrates a preferred embodiment in which a layer of superconducting material 404 is deposited on substrate 402. Referring to FIG. 12, a layer of non-conducting material 406 is deposited on top of superconducting layer 404. Another layer of superconducting material 408 is then deposited on top of non-conducting layer 406. Superconducting channels 410, 412, and 414 may be formed using conventional lithographic techniques. The relative degree of confinement of each superconducting nano-channels 410, 412, and 414 may be geometrically modulated to suit any particular application. For example, superconducting nano-channels 410 and 414 would be more strongly confining than superconducting nano-channel 412, due to the greater relative enclosure of superconducting material. On the other hand, charged particles 416 traveling through superconducting channel 412 will experience Meissner effect repulsion originating from the four quadrants 420, 422, 424, and 426. The structures described in this and other embodiments of this invention may be combined with conventional integrated circuits and micro electromechanical fabrication techniques to produce, but not limited to, imaging and detecting devices.

Figure 13A:
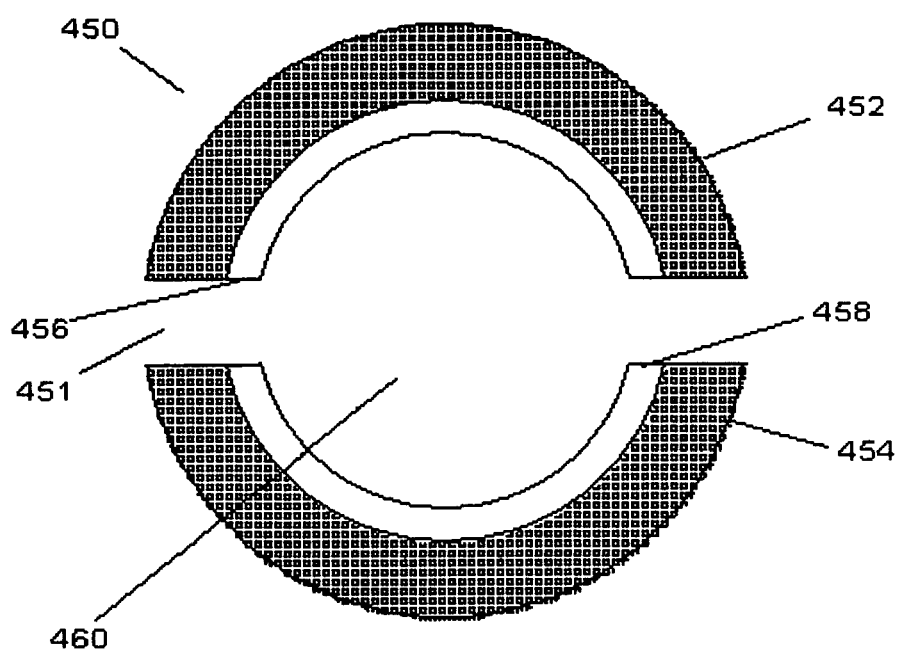
FIGS. 13A and 13B are schematic representations of embodiments of a superconducting nano-channel split in the axial direction.
Figure 13B:
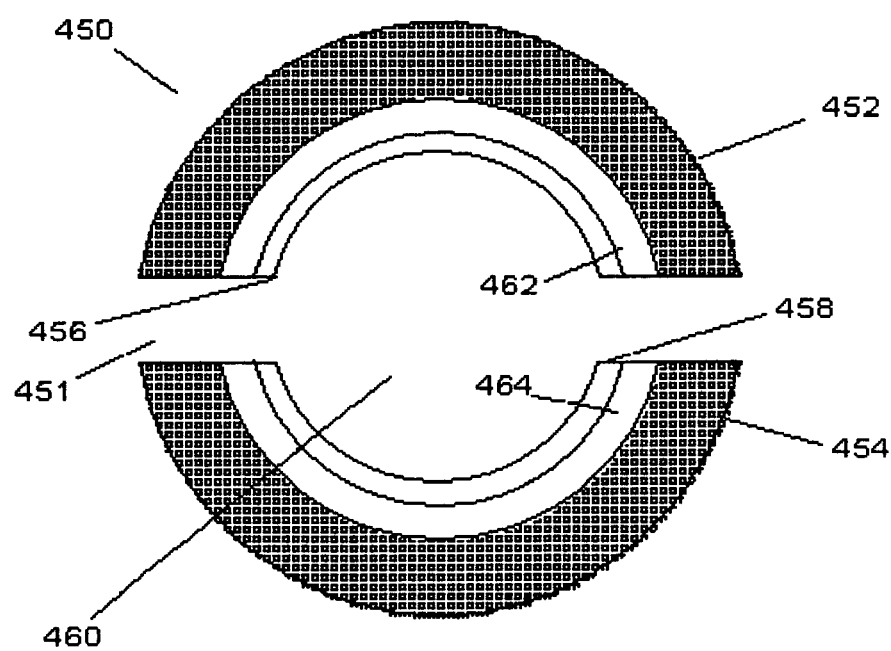

FIGS. 13A and 13B are schematic representations of embodiments of a superconducting nano-channel split in the axial direction, i.e. parallel to the central axis of the nano-channel. FIGS. 13A and 13B illustrate a preferred embodiment in which the superconducting nano-channel is a superconducting nano-cylinder. Referring to FIG. 13A, superconducting nano-cylinder 450 is axially split into two half-cylinders 452 and 454 separated by a small gap 451. A layer of conductive material 456 and 458 may be applied to the inner surfaces of half-cylinders 452 and 454.

Referring to FIG. 13B, a layer of insulating material 462 and 464 separates the inner surface of half-cylinders 452 and 454 and the layer of conductive material 456 and 458. A very small voltage provided by a power source (not shown) may be applied across conductive material 456 and 458. This arrangement would force charged particles traveling through superconducting channel 460 to orient with the electric field within superconducting channel 460 if the charge distribution of said traveling charged particles is in the least asymmetric.

In another embodiment (not shown) superconducting nano-cylinder 450 may be twisted into other shapes, including a double helical slit, so as to impart a torque on particles traveling through superconducting channel 460. Alternatively, superconducting nano-cylinder 450 could be split in several places, creating a plurality of superconducting segments that could be driven by a polyphase AC signal to impart a torque on particles traveling through superconducting channel 460, but in a readily variable and electronically controlled fashion.

An axial cylindrical split into ⅓ and ⅔ radial segments (with an optional helical twist) would "reflect back" a non-uniform repulsive magnetic field.

Figure 14:
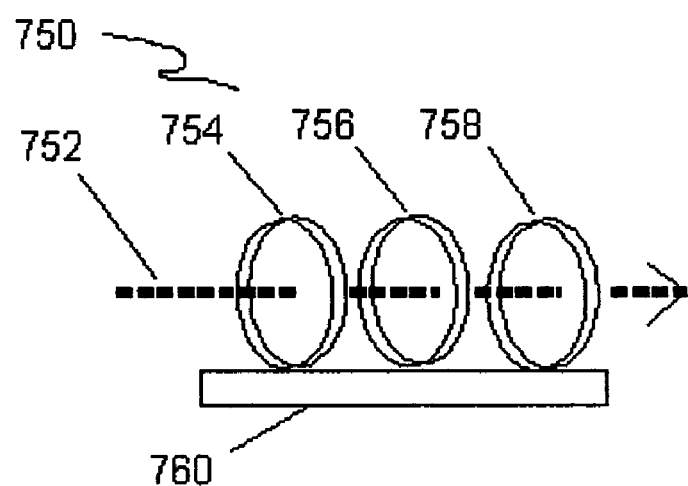
FIG. 14 is a schematic representation of a superconducting nano-channel connected to a support system.

FIG. 14 is a schematic representation of a superconducting nano-channel connected to a support system. Referring to FIG. 14, there is depicted assembly 750, in which superconducting nano-wires are used to make superconducting loops 754, 756, and 758, which are connected to a support system 760. Superconducting loops 754, 756, and 758 constitute an approximation to a whole superconducting tube.

Dividing a superconducting tube into a plurality of superconducting loops offers the same properties of a whole tube while providing additional means for shaping and modulating the charged particle beam. Charged particles 752 traveling through superconducting loops 754, 756, and 758 will experience Meissner effect (repulsion forces). Many other (not shown) wire-like and/or ribbon-like shapes, e.g., ellipses, semicircles, baseball seam curves, U-shaped loops, etc., may be configured as superconducting nano-channels approximations through which charged particles may travel. These shapes may additionally be electrically charged or magnetized (by running electrical currents through them), thereby affording a multiplicity of characteristic particle optical effects. Depending on the relative size and position of such shape superconducting elements relative to charged nano or picobeam trajectories, such shapes may be subject to electrostatic charging, which would alter their particle optical effects. Likewise, depending on the type of support structure used, such shapes may have predetermined discharge rates, and may be cross-coupled to other shapes. Furthermore, the anode currents of electrically split anodes in the path of deflectable charged picobeams may be used to differentially drive various electric or magnetic superconducting shapes, thus influencing the trajectory of the same or other charged nano or picobeams. The use of flexible shapes or flexible mounts adds another dimension of possibilities, both for simple deflection and for multiple mechanical resonance modes, especially since even very small motions can have a geometrically magnified leverage effect on charged nano or picobeams, or an exponentially magnified leverage effect on tunnel currents across small gaps.

Figure 15A:
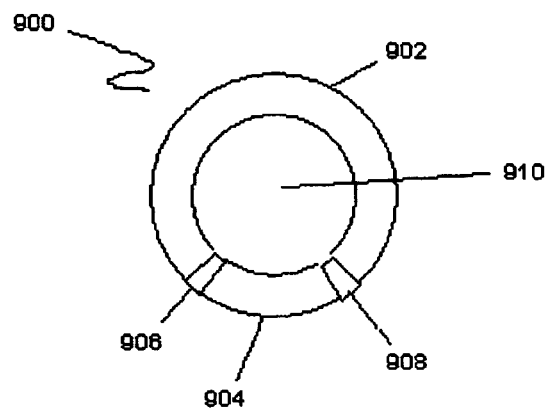
FIGS. 15A, 15B, and 15C are schematic representations of embodiments of superconducting nano-channels split into unequal portions.
Figure 15B:
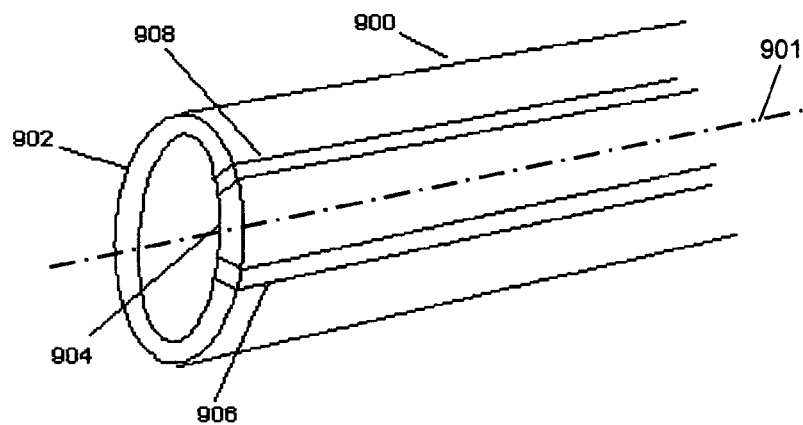
Figure 15C:
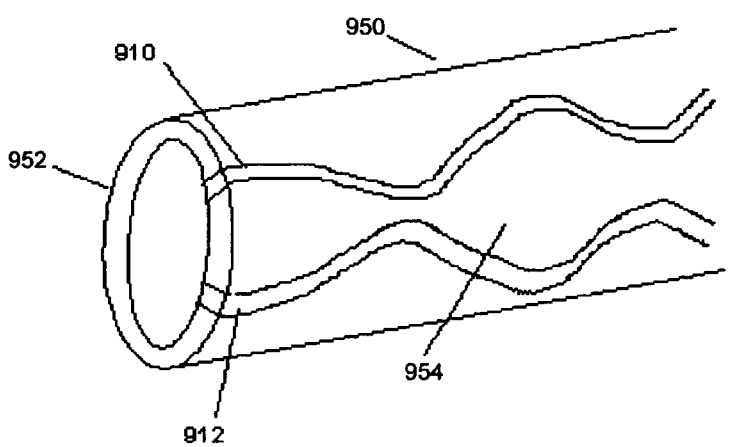

FIGS. 15A, 15B, and 15C are schematic representations of embodiments of superconducting nano-channels split into unequal portions. FIGS. 15A and 15B illustrate a preferred embodiments in which a superconducting cylinder 900, e.g., a superconducting nano-tube which is split into unequal portions along its length by straight split lines 906 and 908, which are parallel to central axis 901 of cylinder 900. FIG. 15B is a perspective view of the embodiment depicted in FIG. 15A. Referring to FIGS. 15A and 15B, superconducting cylinder 900 is split into a major superconducting segment 902 and a minor superconducting segment 904, which have different arc displacements but are of the same radius of curvature. Non-superconducting material in gaps 906 and 908 may be used to hold superconducting segments 902 and 904 together.

FIG. 15C illustrates another embodiments in which a superconducting cylinder 950 is split into a major superconducting segment 902 and a minor superconducting segment 904 by non-straight split lines 910 and 912. Superconducting segment 952 and a minor superconducting segment 954 have different sizes and different shapes. Non-superconducting material may be used to hold superconducting segments 952 and 954 together as described previously.

FIG. 16A-16D are schematic representations of embodiments of merging superconducting nano-channels. In like manner, superconducting nano-channel approximations as described in the embodiment depicted in FIG. 14 may also be merged together. Merged superconducting nano-channels may be used to mix injected charged particles. They may also be used as transport assemblies for charged particles, or to modulate one charged particle beam with another. They may also be used to dynamically switch the trajectory of charged particles from one nano-channel to another.

Figure 16A:
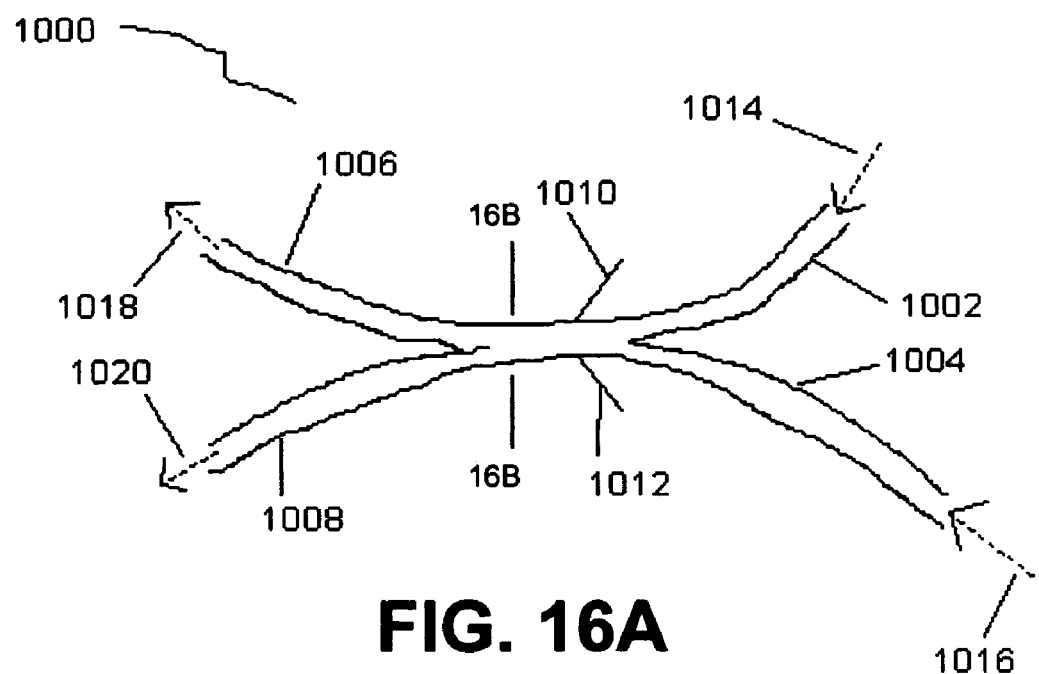
FIG. 16A-16D are schematic representations of embodiments of merging superconducting nano-channels.

Referring to FIG. 16A, superconducting assembly 1000 is shown in which superconducting nano-channels 1002 and 1004, into which charged particle beams 1014 and 1016 are injected and mixed, are first merged together and then separated, forming exit superconducting nano-channels 1006 and 1008, from which charged particle beams 1018 and 1020 emerge. Electrical leads 1010 and 1012 may be used to provide electrical power supplied by a power source (not shown).

Figure 16B:
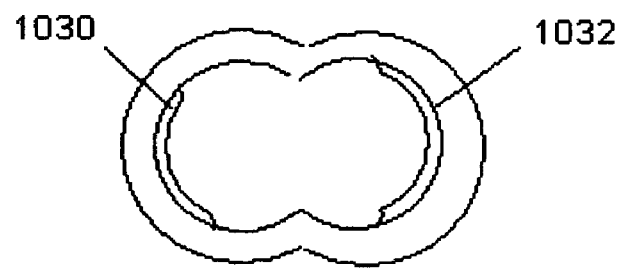

FIG. 16B shows a sectional view of the merged superconducting nano-channels through line 16B-16B of FIG. 16A. In the embodiment depicted in FIG. 16B, electrical conductors 1030 and 1032 located on the inner surface of superconducting assembly 1000 are provided. Referring to FIGS. 16A and 16B, by applying a potential difference to electrically isolated electrical conductors 1030 and 1032, charged particle beams 1014 and/or 1016 may have their exit trajectories switched between superconducting nano-channels 1006 and 1008 to emerge as charged particle beams 1018 or 1020. The walls of superconducting assembly 1000 as shown in FIG. 16A may be partitioned into nearly contiguous but electrically isolated segments, thus negating to need to have separate electrical conductors 1030 and 1032.

Figure 16C:
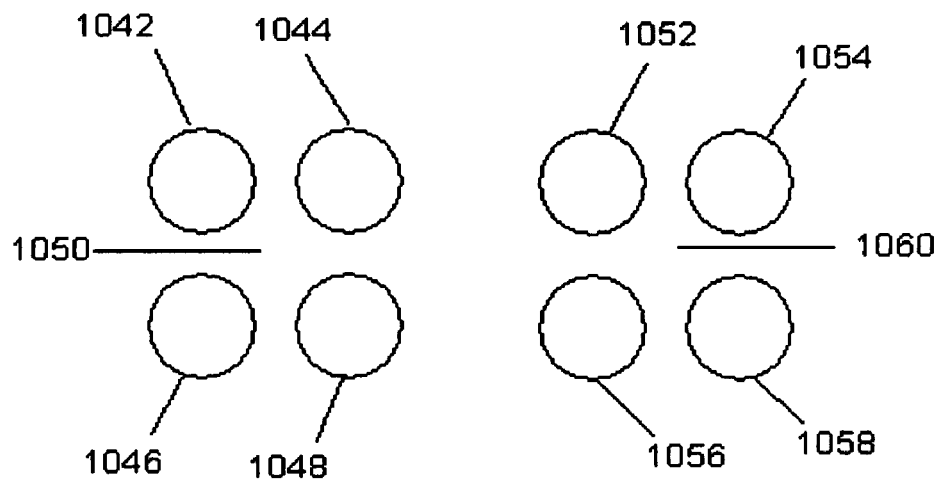

FIG. 16C illustrates a preferred embodiment in which superconducting rods made of superconducting nano-wires are used to form an approximation to a superconducting nano-tube, as previously described in the embodiments shown in FIGS. 11A-11C. Referring to FIG. 16C, superconducting nano-channel 1002 (see FIG. 16A) is approximated by superconducting rods 1042, 1044, 1046, and 1048, to define superconducting nano-channel 1050. Likewise, superconducting nano-channel 1004 (see FIG. 16A) is approximated by superconducting nano-rods 1052, 1054, 1056, and 1058 to define superconducting nano-channel 1060. Electron beams or other charged particles traveling through superconducting nano-channels 1050 and 1060 may be guided and manipulated, taking advantage of the Meissner effect (repulsion forces).

Figure 16D:
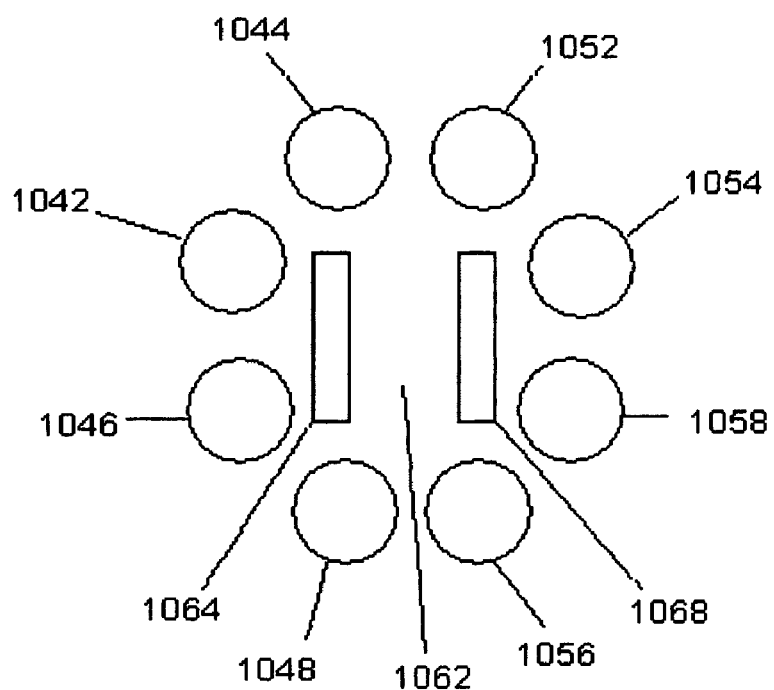

Referring to FIG. 16D, cross sectional view of a superconducting nano-channel created by the merging of superconducting nano-channels 1002 and 1004 at a plane defined by line 16B-16B (as shown in FIG. 16A) is replaced by the approximation defined by superconducting nano-channel 1062, which is created by superconducting rods 1042, 1044,

1046, 1048, 1052, 1054, 1056, and 1058, which in turn are positioned at the corner points of an octagon. An electrical voltage provided by a power source (not shown) may be applied to electrical conductors 1064 and 1068 to guide and manipulate electron beams or other charged particles traveling through superconducting nano-channel 1062. Superconducting nano-channel 1062 thus becomes a switching region where electron beams or other charged particles may be guided to the desired exit channels as described in the embodiment shown in FIG. 16A.

Figure 17:
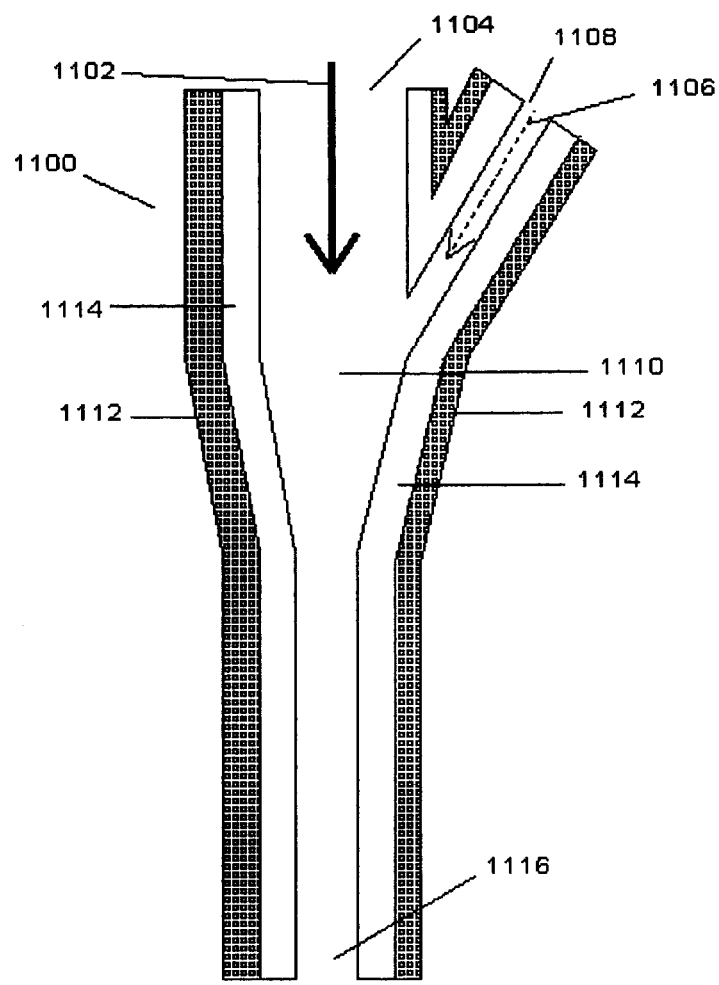
FIG. 17 is a schematic representation of a superconducting nano-channel Y-junction.

FIG. 17 is a schematic representation of a superconducting nano-channel Y-junction. FIG. 17 illustrates a preferred embodiment in which superconducting glass capillaries may be used to guide and manipulate electron beams and other charge particles. Superconducting glass capillaries, with exit ports as small as about 10 nanometers, have an advantageously amorphous and anatomically smooth surface. They may be used for merging, for example, x-rays (both hard x-rays and soft x-rays) and electron beams (both nano and pico beams) or other charged particles. Superconducting glass capillaries may be able to produce geometric beam energy concentration gains on the order of 1000 or more.

Referring to FIG. 17, there is shown a Y-shaped glass capillary 1100 having its inner surface coated with a glass layer 1114, and having its outer surface coated with a layer of superconducting material 1112. Superconducting glass capillary 1100 comprises entry ports 1104 and 1108, and a very narrow exit port 1116. A controllably, intermittent x-ray beam 1102 is introduced into port 1104 and is guided by glass layer 1114, while a controllably, intermittent electron beam or other charged particle beam 1106 is introduced into port 1108 by a side branch coupler (not shown) and is guided by superconducting material layer 1112. Charged particle beam 1106 is introduced at a suitable angle relative to x-ray beam 1102 in order to minimally impact and minimally intercept the x-ray beam 1102. After reaching the intersection area 1110 (i.e. shared space), both beams 1102 and 1106 begin to narrow their spread, before exiting the superconducting glass capillary 1100 through narrow exit port 1116. Both beams 1102 and 1106 are controllably turned ON and OFF by suitable means (not shown) to select which beam (mode) is in operation.

These hybrid superconducting nano-channels, so described because of their ability to guide and manipulate a plurality of beams, may be used for multi-mode imaging, microanalysis, lithography and stereolithography. An application of how this mode switching may be used to perform two distinct functions almost simultaneously will be described as follows: in a first mode, charged particles might be guided and manipulated for imaging and identifying the topography or other feature of a substrate for subsequent x-ray irradiation by a second mode. In another application, electronic beams or other charged particle beams may be modulated over the shared space with intensely concentrated x-rays (or vice versa, with suitable adjustments of electron energy and nano-channel diameter). Additional interactions involving other types of charged particles or nano-particle beams, including transient electron states and ionization is to be considered within the scope of this invention.

Figure 18:
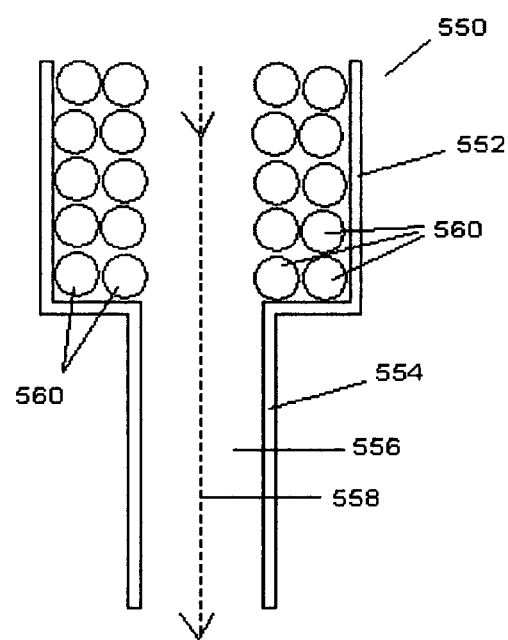
FIG. 18 is a schematic representation of a superconducting nano-channel with internal superconducting wires.

FIG. 18 is a schematic representation of a superconducting nano-channel with internal superconducting wires. FIG. 18 illustrates a preferred embodiment in which superconducting nano-channels have different diameters at their respective ends. In the case of unidirectional propagation, the beam input end has a larger diameter than the beam exit end. The larger diameter allows the superconducting nano-channels to internally accommodate a plurality of superconducting wires defining coaxial structures, which may be arranged in a straight, helical, or other suitable configurations. An electrical potential provided by a power source (not shown) may be applied to the coaxial structures to modulate the axial and radial velocity components of electron beams or other charged particles traveling through the superconducting nano-channel.

Referring to FIG. 18, superconducting nano-channel 550 is shown having a beam input end 552 and a beam exit end 554. The diameter of beam input end 552 is larger than the diameter of beam output end 554. Beam input end 552 accommodates a coaxial structure comprising superconducting nano-wires 560. An electrical potential provided by an electrical source (not shown) and applied to superconducting nano-wires 560 may be used to modulate the axial and radial velocity components of electron beam or other charged particle beam 558 traveling through central channel 556.

Figure 19:
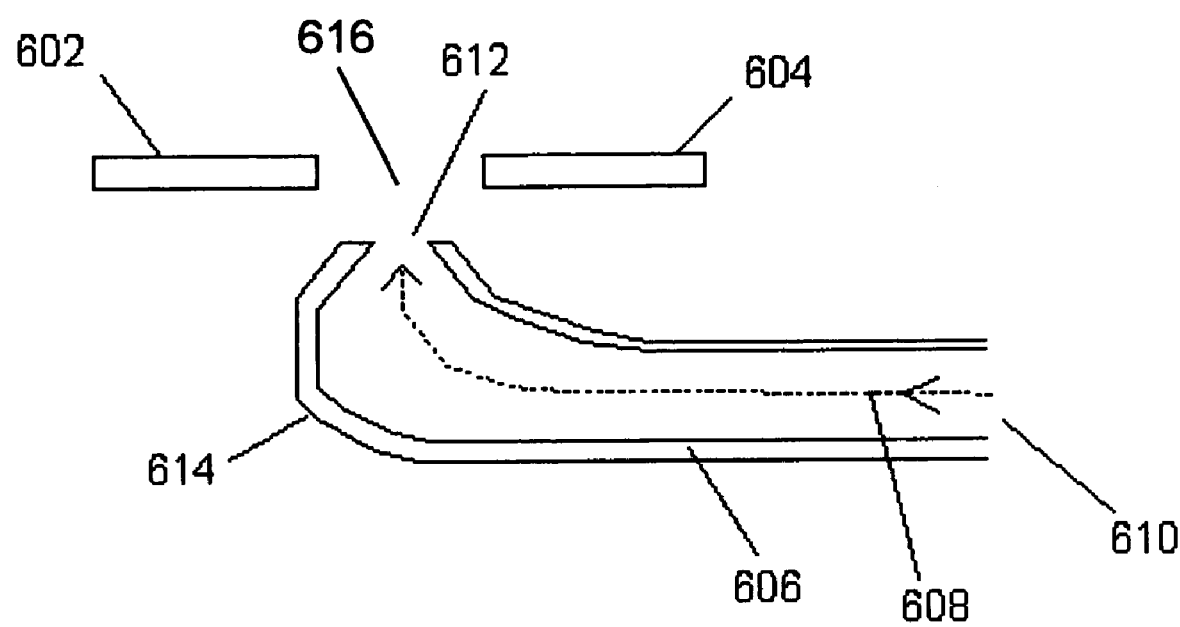
FIG. 19 is a schematic representation of a superconducting nano-channel as a field ionizer.

FIG. 19 is a schematic representation of a superconducting nano-channel as a field ionizer. FIG. 19 illustrates a preferred embodiment in which superconducting nano-channels are used as volcano field ionizers for magnetic nano-particles. Volcano field ionizers make use of a relatively small diameter hollow cathode tube for injecting materials into a region with a very high electric field gradient, which subsequently ionizes the injected materials.

Referring to FIG. 19, superconducting nano-channel 606 is shown having an optional bend region 614. Superconducting nano-channel 606 comprises beam input end 610 and beam exit end (nozzle) 612. A beam of magnetic nano-particles 608 is injected into the superconducting nano-channel 606 through beam input end 610 and exits through nozzle 612. Electrodes 602 and 604 provide a large electrical potential difference between electrodes 602, 604 and nozzle 612. Said large electrical potential difference ionizes magnetic particles 608 in the vicinity of the high electric field region 616 of nozzle 612. Electrodes 602 and 604 may optionally be part of another follow-on superconducting nano-channel segment.

In another embodiment (not shown), superconducting nano-channels may be used to focus and guide traveling antiprotons for medical applications, such as killing tumors. A suitable liquid nitrogen capillary micro-transport system using a suitable aerogel-based super-insulation may be used for chilling the superconducting nano-channel. Thus, rather than having to use a high energy beam to hit the tumor from multiple angles (which damages other healthy tissue along each such path—i.e. overshoot and undershoot), a single lower velocity beam could be delivered directly to the ultimate target by a thin superconducting nano- or micro-channel probe of the types described elsewhere in this specification. A low velocity beam could be more readily deflected (steered to target) at the tumor site by micro-deflection coils or micro-deflection electrodes than high velocity beams. Since the matter/anti-matter interaction region would thereby be highly localized, so too would the relative density and distribution of (e.g., gamma-ray) radiation of the anti-proton/proton annihilation.

Figure 20A:
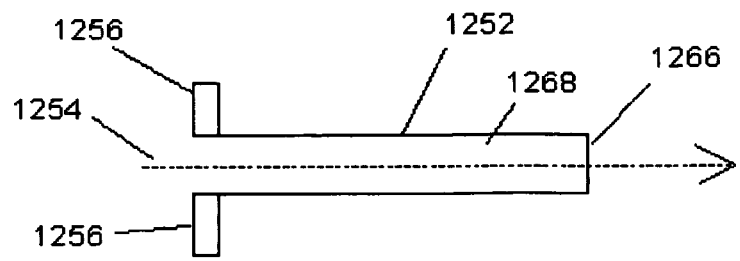
FIG. 20A-20C are schematic representations of a superconducting nano-channel as a component of an acoustic wave detector system.
Figure 20B:
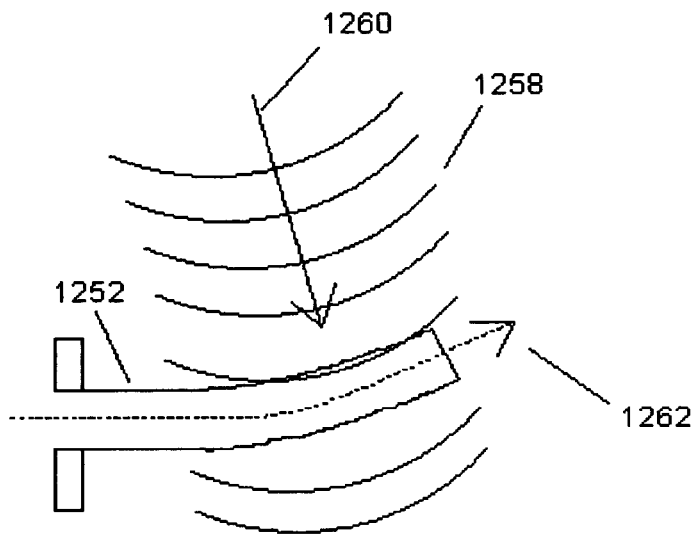
Figure 20C:
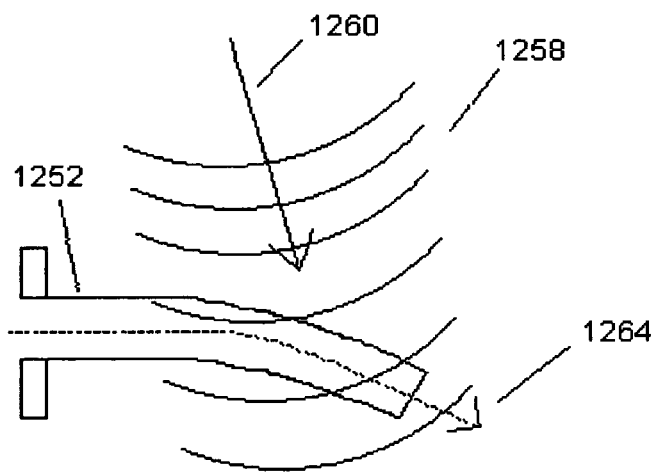

FIG. 20A-20C are schematic representations of a superconducting nano-channel as a component of an acoustic wave detector system. FIGS. 20A-20C illustrate a preferred embodiment in which superconducting nano-channels may be used as integral components of an acoustic wave detector. If coherent (i.e. highly monochromatic and well collimated) electron beams or other charged particle beams or magnetic nano or pico-beams are injected into superconducting nano-channels that are deformable by acoustic waves, the acoustic waves produce pronounced perturbations in the electron beams or other charged particle beams or magnetic nano or pico beams as they travel through the superconducting nano-channel. The charged particles exit the superconducting nano-channel in a perturbed state.

Referring to FIG. 20A, charged particle beam 1254 is injected and travels through superconducting nano-channel 1252, which is attached to support 1256. An end cap 1266 is used to cap superconducting nano-channel 1252 and to keep vacuum within region 1268 of superconducting nano-channel 1252. In the absence of acoustic waves, superconducting nano-channel 1252 remains motionless.

Referring to FIGS. 20B and 20C, acoustic wave 1258 propagating in the direction shown by arrow 1260 will cause superconducting nano-channel 1252 to oscillate back and forth, thus deflecting the charged particle beams 1262 and 1264 as they exit superconducting nano-channel 1252. Position sensitive beam detectors (not shown) may be used to detect deflected beams 1262 and 1264 as they exit superconducting nano-channel 1252. These superconducting nano-channel configurations, which take advantage of deflected charged particles, may be used in analog signal processing devices, high-sensitivity and high-bandwidth nano-vibration sensors, pico-beam scanning and chopping operations, and the like. Furthermore, systems comprising superconducting nano-channels, in which deflected charged particles may be modulated, may be suitably mechanically loaded and mechanically driven for generating charged particle scanning patterns.

The superconducting nano-channel structures of this invention, comprising carbon-based nanotubes or other types of nanotubes, may be used with microscopy probes. They may also operate with a miniature ultra-high vacuum enclosure with an electron-transparent widow. Furthermore, these structures may be combined with conventional integrated circuits and micro electromechanical fabrication techniques to produce various devices including, but not limited to, imaging and detecting devices.

Figure 24A:
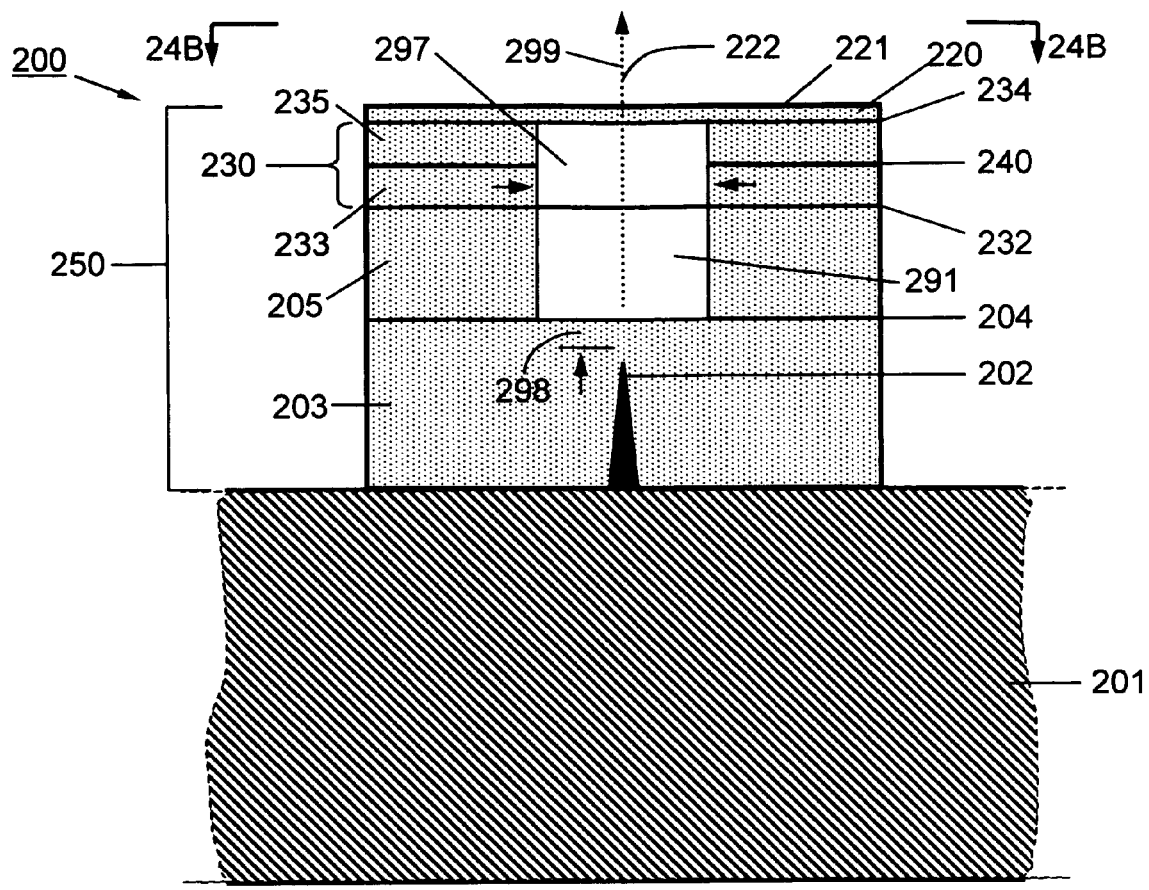
FIG. 24A is a cross-sectional schematic representation (not to scale) of one embodiment of a solid state sub-nanometer-scale electron beam emitter of the present invention.
Figure 24B:
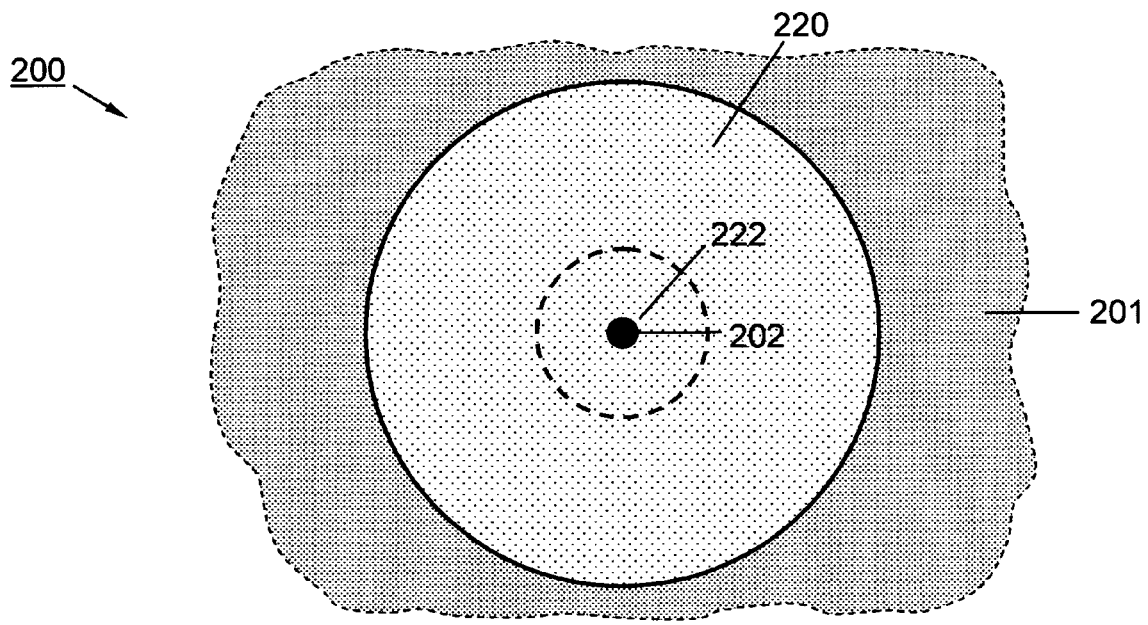
FIG. 24B is a top view of the solid state sub-nanometer-scale electron beam emitter of FIG. 24A, taken along the line 24B-24B of FIG. 24A.

FIG. 24A is a cross-sectional schematic representation (not to scale) of one embodiment of a solid state sub-nanometer-scale electron beam emitter (shown together with an optional integrated electrostatic lens) of the present invention. FIG. 24B is a top view of the solid state sub-nanometer-scale electron beam emitter of FIG. 24A, taken along the line 24B-24B of FIG. 24A. Referring to FIGS. 24A and 24B, emitter 200 is formed on a substrate 201, preferably a silicon chip substrate. Emitter 200 is a multi-layered structure comprising nano-tip electron emitter and tunnel emission junction 202 formed on substrate 201, initial electron beam extraction electrode 204, "nano-sandwich Einzel lens" electrode 230, and topmost protective layer 220.

Nano-tip electron emitter 202 is formed on substrate 201, and is preferably an atomic point emitter, or nearly atomic point emitter. "Nano-sandwich Einzel lens" electrode 230 functions as an electron beam lens (i.e. an electrostatic focusing lens), and comprises a lower metal membrane and primary electron beam acceleration electrode 232, annular metal electrode 240, and upper metal membrane electrode 234. In the preferred embodiment, interior region 297 and interior region 291 immediately therebeneath are devoid of material, and constitute nano-vacuum chambers. Topmost protective layer 220 is preferably a nano-layer of diamond, or other suitable electron-transparent material such as silicon nitride, or aluminum oxide. Similar electron transparent material is also used in the spacing of nano-layers 203, 205, 233, and 235, between electrodes 204, 232, 240, and 234, with diamond being one preferred material due to the ruggedness, heat conductivity, and negative electron affinity thereof.

In operation, electrons emitted from nano-tip emitter 202 are emitted through protective layer 220 in region 222, as indicated by arrow 299. Further details regarding the structure of electrostatic focusing lens 230 and the fabrication of embodiments of emitter 200 will be presented subsequently in this specification.

In one embodiment, emitter 200 is fabricated with layer 203 between about 10 and about 1,000 nanometers in thickness, layer 205 between about 1 and about 100 nanometers in thickness, layer 233 between about 1 and about 100 nanometers in thickness, layer 235 between about 1 and about 100 nanometers in thickness, and protective layer 220 between about 1 and about 10 nanometers in thickness. Emitter 200 is shown in FIGS. 24A and 24B as being substantially cylindrical is shape, although some variation from a cylinder is permitted, provided that the spatial relationships between the nano-tip emitter 202, the electrodes 204, 232, 240, and 234, and the layers 203, 205, 233, 235, and 220 are maintained. In one embodiment, a substantially cylindrical diameter emitter 200 is provided having a diameter of between about 10 and about 1,000 nanometers.

Electrodes 204, 232, 240, and 234 are preferably formed of metallic films and are preferably between about 1 and about 10 nanometers thick. In one embodiment, annular electrode has an opening 297 of between about 10 and about 100 nanometers in diameter. In one embodiment, electrodes 204, 232, 240, and 234 are formed of carbon graphene films/sheets/membranes of about 0.1 nanometer thick (i.e. a single atomic layer) to about 5 nanometers thick (i.e. multiple atomic layers).

In one embodiment, nano-tip emitter 202 is formed in a substantially conical shape, extending upward form substrate 201 to a height of between about 20 nanometers and about 80 nanometers, and preferably about 50 nanometers, and approximately a 1 nanometer separation distance 298 from initial electron beam extraction electrode 204, which in one embodiment is fabricated from polycrystalline platinum. Other tip shapes may be provided that vary from a conical shape, with the operative requirement being that such shapes terminate at the upward or distal end with a sharp tip that is positioned sufficiently close to the extraction electrode such that quantum tunneling emission occurs from the tip atom nearest the extraction electrode. This situation is directly analogous to the case of a scanning tunneling microscope tip over a metallic sample, with the crucial difference that the tip and tunneling gap are embedded in a rigid, stable, rugged, and protective solid state structure. In general, the distance between the distal end of nano-tip emitter and the top surface 221 of protective layer 220 is between about 1 and about 10 nanometers, and more preferably between about 2 and about 5 nanometers.

In one embodiment, layer 205 is omitted, and electrodes 232 and 204 are merged into a single electrode that serves a dual function of extraction electrode and the electrode of an electrostatic lens. In another embodiment of this case involving extremely small dimensions for the electrode spacing 230 of less than about 10 nanometers, the evacuated region 297 is filled with an insulating electron transparent material, which is also used for layers 233 and 235.

In one embodiment, the electrostatic lens subsystem is omitted, and protective layer 220 directly covers extraction electrode 204.

The use of sharply pointed field emission electrodes in an evacuated environment is one of the most common means of generating electron beams for applications requiring high beam quality and very fine focusing. In such field emission systems, the sharp tip geometry leads to a highly localized and intensely concentrated electric field gradient, which makes it possible to extract an electron beam with moderate applied voltages.

Miniature electron beam sources known as microcolumns have been studied and prototyped for use in electron beam lithography. (See for example, the aforementioned "Fabrication of electron-beam microcolumn aligned by scanning tunneling microscope", Jeong-Young Park, et al., previously cited in this specification.) The characteristic dimensions of microcolumns in such studies are on the order of microns ($10^{-6}$ meters). Microcolumn types of structures have also been considered for miniature scanning electron microscopes; see for example, Thomas George (1998). "Miniature Electron Microscopes Without Vacuum Pumps", NASA Technical Brief, Vol. 22, No. 8.

The nano-emitter system of the present invention system may be regarded as a dramatically further miniaturized microcolumn that advantageously utilizes and/or results from certain nano-scale electronic properties of materials. Accordingly, the applicant believes that the use of the nano-emitter system of the present invention in such electron beam lithography and electron microscopy systems will provide superior performance in the respective applications thereof.

Various embodiments of nano-emitter system 200 of FIG. 24A provide significant improvements to these previously disclosed microcolumn systems. One embodiment is directed to the nano-tip emitter 202, wherein instead of using a relatively crude (on the nanoscale) conical field emitter, there is provided an atomic point emitter, such as a perfect tungsten tetrahedral tips with one emitting atom, or a nearly atomic point emitter, such as small diameter carbon nanotubes. Such tungsten and carbon nanotubes emitter tips have been described previously in this specification, with regard to the embodiments of enclosed point source electron beam generators shown in FIGS. 1, 2, 3, and 21. As indicated in the previously cited papers coauthored by H. W. Fink, such atomic point field emitters operating in ultra-high vacuum may be used to generate exceptionally narrowly focused electron beams with narrow energy spreads that are also coherent, i.e. such focused beams can generate interference patterns. Nano-emitter tips formed from certain carbon nanotubes are almost as effective in generating such focused electron beams.

However, in certain circumstances, some of such emitters are not sufficiently robust and stable for the purpose of being used as an electron beam emitter tip. For example, such an emitter tip can be degraded by reverse ion bombardment, particularly in applications wherein such a tip is disposed in an ultra-high vacuum chamber, rather than in a solid state device. In spite of this, these emitters may be useful in solid state nano-emitters of the present invention because at certain electron energies, certain insulating and metallic nano-layers formed therein are effectively electron-transparent.

Over the extremely small electron path distances within devices of the present invention, some or all of the normally high-vacuum electron beam path is judiciously replaced by solid materials, such as those recited previously with regard to FIGS. 24A and 24B. At a minimum, the crucial emitting tip is protectively encapsulated, such as e.g. the encapsulation of tip 202 in layer 203 of emitter 200 of FIG. 24A. At a maximum, the entire emitter column 250 and electrostatic focusing lens 230 (or lenses) therein is solid state, wherein the total required electron-beam path length from the distal end of nano-tip 202 to the surface 221 of protective layer 220 is sufficiently reduced.

In one embodiment of the nano-emitter system 200 of the present invention, there is made advantageous use of the metal-vacuum-metal quantum tunneling phenomenon. Such phenomenon is described in U.S. Pat. No. 5,587,586 of Kruit entitled "Particle-optical apparatus comprising an electron source with a needle and a membrane-like extraction electrode," the disclosure of which is incorporated herein by reference. Such use of the metal-vacuum-metal quantum tunneling phenomenon is made by reducing the emitter-to-extractor electrode distance 298 of device 200 such that the emitter tip is disposed in extremely close proximity to electron-transparent metal membrane 204, which functions as the initial electron beam extraction electrode. In one embodiment, the emitter-to-extractor electrode distance 298 of the device is about 1 nanometer.

In the preferred embodiment of the nano-emitter system 200 of the present invention, electron-transparent metal membrane electrodes are incorporated into system 200 such that the size of electrostatic lens(es) of the system are greatly reduced. The structure of one such preferred electrostatic lens 230 of system 200 will be described subsequently in this specification.

The foregoing structures of the nano-emitter system 200 of the present invention are combined in a manner that renders various embodiments of system 200 as miniaturized solid-state analogs of known vacuum micro-electronic devices (VMEDs). These devices avoid many of the production, reliability, and stability problems that have delayed wider commercial applications of VMEDs in general and thus have many advantages over VMEDs and other electron emitter devices.

Compared to conventional solid state electronic devices, vacuum electronic devices have the advantage that electrons propagate ballistically, they can attain substantially higher transport speeds (at moderate voltages), and they can maintain their mutual coherence at high temperatures above absolute zero (such as room temperature). However, over extremely short nano-scale distances (in suitable material systems, at suitable electron energies), the above advantages are retained to a substantial degree in the nano-emitters of the present invention, since the normal sorts of disruptive scattering interactions require somewhat longer distances to become predominant. Such distances are not present in the nano-emitters of the present invention.

In addition, the very small probe size of the nano-emitter minimizes the beam demagnification requirements. Electron beams with about 1 milli-radian convergence angle are needed for good depth of field. In addition, aberrations in electrostatic lenses tend to decrease with decreasing lens size, and hence the extremely small size of the nano-sandwich Einzel lens of the nano-emitter is a lens with minimal aberrations. Operation of nano-electron-beam components at very low voltages allow operation in air without causing electron collision ionization of residual gas molecules and subsequent ion sputtering (i.e. reverse ion bombardment). Cleaning issues and processes, which are more favorable for integrated solid state emitters, are also less problematic.

The effective use of rugged nano-electron-beam sources of the present invention for high-resolution nano-SEMs and ultra-nanolithography should be feasible even at atmospheric pressure, at distances comparable to the mean free path of air molecules, i.e. in approximately the 100 nanometer range. (It is noteworthy that the "flying height" of read/write heads of some experimental very high performance magnetic disc drives now approach this range.)

In addition to the nano-electron-beam emitter source, an electron lens or lenses are a crucial component that is integrated into the nano-emitter system 200 of the present invention. At the very small dimensions of the system 200, it is generally easier to utilize electrostatic rather than magnetic lenses particularly at room temperature. By using electron-transparent metallic nano-layers as electrostatic lens electrodes in the system 200, ultra-compact and more versatile nano-scale analogs of conventional Einzel electrostatic lenses are made possible, and are integrated into the system 200. The use of an extremely thin metal foil as an aberration corrector for electron microscopes is described in "Low-energy foil aberration corrector", R. H. van Aken, C. W. Hagen, J. E. Barth, and P. Kruit, Ultramicroscopy, Volume 93, 2002, pp. 321-330. In contrast, the system described herein is a self-contained, encapsulated, nano-scale electrostatic lens intended for direct integration with a sub-nanometer electron beam source.

FIG. 25 is a cross sectional schematic diagram of a conventional Einzel electrostatic focusing lens for focusing an electron beam passing therethrough. Referring to FIG. 25, lens 330 comprises a first annular electrode 340, above and below which are disposed second annular electrode 334, and third annular electrode 332 respectively. Typically, a focusing voltage $V_f$ is applied to electrode 340, and electrodes 332 and 334 are at ground (zero) potential. Electrons that are discharged from an electron beam source (not shown) follow an overall general trajectory through the lens as indicated by arrow 399. Such electrons enter lens 390 along trajectories 396 that are divergent in region 395. The electrostatic effect of electrodes 340, 332, and 334, as indicated by electric field lines 393 result in the convergence of the electron trajectories 396 in region 394 and the focusing of the electron beam at focal point 393.

FIG. 26A is a detailed cross sectional view of one embodiment of a "nano-sandwich Einzel" lens 230 of the nano-emitter system 200 of FIG. 24A. Referring to FIG. 26A, lens 230 comprises annular metal electrode 240, above and below which are disposed upper metal membrane electrode 334, and primary electron beam acceleration electrode 232 respectively. In one mode of operation used for focusing an electron beam, a focusing voltage $V_f$ is applied to electrode 240, and electrodes 232 and 234 are at ground (zero) potential. Electrons that are discharged from emitter tip 202 (see FIG. 24A) follow an overall general trajectory through the lens as indicated by arrow 299. Such electrons enter lens 290 along trajectories 296 that are divergent in region 295. The electrostatic effect of electrodes 240, 232, and 234, as indicated by electric field lines 293 result in the convergence of the electron trajectories 296 in region 294 and the focusing of the electron beam at focal point 293.

The extremely small scale of the structure of lens 230 provides it with significant advantages over conventional Einzel electrostatic lenses. The geometry of lens 230 results in high structural strength thereof. The operation of lens 230 can be varied to provide both focus and defocus (convergent and divergent) modes, unlike conventional Einzel lenses, which can only focus charged particles. The extremely compact size of the "nano-sandwich" lens 230 (particularly along the direction of the electron beam axis 299) results in acceptable electron beam focusing performance when using a solid state sandwich structure as indicated in FIG. 26A, and in FIG. 24A for the nano-electron-beam emitter 200 previously described in this specification. With regard to lens 230 of FIG. 26A and emitter 200 of FIG. 24A, instead of an internal vacuum, the interior regions 203, 205, 233, and 235 thereof are filled with thin films of suitable electron transparent material such as diamond, silicon nitride, or aluminum oxide. Such a structure simplifies mass production of the lens and emitter devices, and also facilitates the stacking of additional lens stages, i.e. the forming of lenses in series that share adjacent metallic nano-layer electrodes, for applications requiring high performance electron optics.

In a further embodiment, lens 230 of FIG. 26A may be formed with a central electrode that is segmented, rather than formed as an annulus. FIG. 26B is an axial cross sectional view of the lens 230 of FIG. 26A, taken along the line 26B-26B therein. Referring to FIG. 26B, lens 230 comprises a unitary annular metal electrode 240 having an internal diameter 297 (see also FIG. 24A). FIG. 26C is an axial cross sectional view of the lens 230 of FIG. 26A wherein the central electrode 241 thereof is comprised of a plurality of segments. In the embodiment depicted in FIG. 26C, central electrode 241 comprises segments 242, 244, 246, and 248. In operation, these segments may be set to different voltages, either statically or dynamically, in order to provide electron beam focusing, defocusing, and/or steering away from the central axis of the lens. It will be apparent that many other configurations and quantities of electrode segments are possible, other than the four segmented embodiment depicted in FIG. 26C.

The capabilities of lenses comprised of these multi-segmented electrodes offer opportunities for aberration correction of an electron beam passing therethrough. Such capabilities may also enable the mass production nano-scale scanning electron microscopes with routine atomic resolution.

The extremely compact size of the solid-state nano-electron-beam emitters and lenses of the present invention also enable them to be fabricated on the moving parts of micro-electromechanical systems or on microsystems such as e.g., the tilt-up elements of the type used in micro-optical systems. Arrays of nano-electron-beam nano-lenses of the present invention may be manufactured and used independently of nano-electron-beam sources, for purposes of either nano-lithography or nano-microscopy with more conventional electron beam sources. Such nano-lens arrays may also serve as a new type of photomask that may subsequently be used for fabricating replicas of itself, and then subsequently fabricating arrays of nano-electron-beam emitters together with such lenses.

The nano-lenses of the present invention require strong localized electric fields in order to operate as desired. In addition to the means for providing such fields that was described previously, there are the following alternative and less conventional means for providing the strong localized electric fields needed for nano-electron-beam nano-lenses:

1. The use of nano-layer p-n semiconductor interfaces and nano-layer semiconductor-metal interfaces to provide built-in electrostatic fields for nano-lenses; and the use of spherical (and other lenticular shape) multilayer nanoparticle "onions" of similar materials to provide curved electric fields. Transient overdriving of proto-emitters (i.e. partially formed emitters) might also be used to induce precisely-aligned radial variation of material properties from thermal diffusion, electromigration, and reverse ion bombardment.
2. The exploitation of secondary electron emission to dynamically charge (i.e. focus, deflect, or switch) the (internal or external) electrodes.

3. The use of ultraviolet light driven processes (e.g., photoemission charging, and/or plasmons) for nano-electronic lenses.

Referring again to FIG. 24A, in one embodiment, an exceptionally compact nano-emitter tip 202 is first formed on substrate 201 by depositing a $C_{60}$ buckyball. In another embodiment, the nano-emitter tip 202 may be a capped carbon nanotube.

Rather than using a scanning tunneling microscope (STM) to adjust the tunnel gap between the atomic-point emitter electrode and the electron-transparent metallic nano-layer in the formation of layer 203, a controlled deposition of a nano-layer of diamond, silicon nitride, or aluminum oxide over the emitter is used to form layer 203. A nano-layer of a suitable refractory metal for the extraction electrode 204 is deposited next, followed by another nano-layer 205 of the underlying material. Accelerating electrode 232, which also serves as the lowest electrode of the electrostatic lens 230, cover layer 233 are formed in like manner.

In the preferred fabrication process embodiment, the annular nano-sandwich electrode 240 is preferably formed by exploiting the underlying emitter 202 for a highly localized form of "backwards" or "reverse" electron beam nano-lithography. A conventional electron-beam resist is used, i.e., deposited, exposed, and developed, to form an image of electrode 240, with the difference that the electron beam is exposing or writing the image of electrode 240 from the substrate 201 side rather than from the surface 221 side. This is an automatically self-aligning process, and an inherently parallel production process. Once annular electrode 240 is formed, another insulating layer 235 is added (optionally involving some backfilling and planarization process steps), followed by deposition of another metallic nano-layer 234.

In a further embodiment using a suitable external electron beam source, after or during device fabrication, the nano-sandwich-Einzel-lens structure may be operated in reverse for emitter "fine tuning", i.e. adjusting the tunnel gap between the atomic-point emitter electrode 202 and the electron-transparent metallic nano-layer 204, or sharpening the tip of emitter electrode 202 (see FIG. 24A).

In a further embodiment of device fabrication, curing of support material using ultraviolet light is performed following precise positioning of emitter 202 and the extraction grid.

In another embodiment of device fabrication, emitter activated reverse ion bombardment is used to perform self-aligned processing.

Additional embodiments of electron beam emitters of the present invention, and applications there of are as follows:

Emitters wherein the emitter tips comprises tungsten-tipped carbon nanotubes using tungsten tetrahedral or octahedral nanoparticles.

Emitters which use nanoparticles on the end of a conventional tips or even flat surfaces in lieu of ultra-sharp tips for tunnel junction field emitters.

Emitters which use nano-wire or carbon nanotube cross-over junctions (preferably in large cross hatch arrays) to form tunnel junction nano-field-emitters. (This amounts to perpendicularly-combining two nearly-intersecting axially-centered intense field gradient concentrations to get the roughly equivalent effect of a point-to-plane intense field gradient concentration.)

Emitters comprising diffraction mode transmission electron lenses. (For sufficiently coherent nano-electron-beams, a multilayer nanoparticle "onion" is one embodiment.)

The performance of near-field electron microscopy/spectroscopy using a nano-emitter of the present invention disposed immediately adjacent to the tip of an atomic force microscope.

Emitters comprised of quantum wells, quantum dots, and/or superlattice structures.

Emitters of the present invention that are nano-electron-beam analogs of photonic crystals.

There are many potential applications for the nano-electron-beam nano-field-emitters of the present invention, for which the extremely small size and performance thereof will provide application results not previously attained, or new capabilities that have not been previously realized. In using the emitters of the present invention in scanning electron microscopy, the very small size of the electron source and electron optics thereof enables the specimen vacuum chamber to be very small. Pump-down time of the vacuum chamber can thus be extremely short. In addition, operation of a scanning electron microscope at low vacuum and even at atmospheric pressure is possible due to the extremely short path lengths that result from the use of the sub-nanometer-scale electron beam emitter.

One may exploit the coherent properties of nano-electron-beams for signal processing and computing. See for example, U.S. Pat. No. 5,233,205 of Usaguawa et al., "Quantum Wave Circuit," and U.S. Pat. No. 5,247,223 of Mori et al., "Quantum Interference Semiconductor Device," the disclosures of which are incorporated herein by reference. The multiple high-quality nano-electron-beams that may be provided from arrays of nano-emitters of the present invention enhance the possible uses of the devices and methods disclosed in these patents.

With regard to electron beam lenses, one may smoothly vary the tunneling band gap for nano-electron-beam lenses of the present invention. See for example, U.S. Pat. No. 6,680,214 of Tavkhelidze et al., "Artificial Band Gap," the disclosure of which is incorporated herein by reference. This method for uniformly lowering the effective work function for broad area (non-point, non-beam) tunnel emitters may be applied in a non-uniform radially varying way to function as a lens element involving pairs of closely spaced nano-emitter electrodes of the present invention.

One may further provide non-metallic electrodes for sandwich-Einzel lenses, as is disclosed in U.S. Pat. No. 6,214,651 of Cox, "Doped Diamond for Vacuum Diode Heat Pumps and Vacuum Diode Thermionic Generators," the disclosure of which is incorporated herein by reference. In such Einzel lenses, non-metallic conductors are used instead of metal for thin-film electrodes, and preferably for the central annular electrode as well. At electron energies where metal films are relatively opaque to electrons, it may be advantageous to use doped diamond, especially in cases where diamond is already being used as the inter-electrode material. Moreover, the use of doping processes in a smoothly varying manner enables the use of additional geometric parameters for the shaping of electrostatic lensing fields.

One may also apply the nano-emitters of the present invention to provide tunnel emission cooling systems; see for example, U.S. Pat. No. 6,417,060 of Tavkhelidze et al., "Method for Making a Diode Device," the disclosure of which is incorporated herein by reference. This particular sacrificial layer process depends on bulk mechanical motion followed by precision positioning. However, the need for large connected emitting surfaces with extreme matching surface requirements and extreme relative positioning requirements may be eliminated by factoring the tunnel gap from the collection electrode using a multitude of individual point nano-emitters of the present invention. This also provides a system having much greater flexibility for implementing alternative geometric configurations.

The nano-emitters of the present invention may also be used to provide exceptional integral cooling of other emitter systems being driven at much higher than normal power levels for high-power electron beam systems. Cooling emitter arrays may be arrayed in concentric circles to provide cryogenic cooling of capillary superconducting tubes that exploit the Meissner effect for the propagation of particle beams for various medical and scientific applications. For example, it would be advantageous in many medical and research applications to have near-microscopic cryogenic coolers for Josephson junction sensors.

In a further application embodiment, one may fabricate nano-vacuum chambers. Such a fabrication involves the use of thin layers of bimetallic materials for which post-deposition cooling induces powerful localized buckling stresses in order to form nano-vacuum chambers for (lateral and perpendicular) electron pathways of lenses, emitters, and other structures. In a preferred embodiment, suitable patterns of thin films of insulating analogs of bimetallic materials, or the less stable form of Nitinol (NiTi) are formed, possibly capped with a layer of strained diamond. The aim of such structures is to form stable "vacuum blisters" when the films are extremely rapidly spot heated with a laser of the appropriate wavelength. For some types of materials and interfaces, a flattened central drop of material may be formed which cannot revert to its original thin film form. Due to the scales involved, the transient heat pulse is very rapidly dissipated into the surrounding material, resulting in near-instantaneous cooling with negligible effect to surrounding regions. These are the conditions under which metallic glass states can be formed, thereby forming a structurally strong blister.

In another application embodiment, integrated circuit chips with a large array of nano-field-emitters of the present invention may make use of electron-beam induced carbon deposition processes (among others) instead of the conventional chip-to-chip bonding processes. Dramatically smaller bonding pads with much smaller interconnections may be used. This application is somewhat analogous to a neuron growing a dendritic connection. In this embodiment, the growing connection from a facing chip ultimately makes contact with an electrical contact that is immediately adjacent to (and possibly encircling) the nano-field-emitter. In the simplest cases, the nanosandwich-Einzel lens may be omitted. For more complex cases with additional beam steering capability, many off-axis "dendrites" are grown and connected into one conductor that ultimately makes contact with the adjacent target electrode.

In another application embodiment, micro-electromechanical (MEMS) chips with an arrays of tilt-up nano-field-emitters make use of electron-beam imaging and processing to wire and weld themselves, and likewise work on and couple to each other in various self-extending post-production processes.

Further applications for the nano-emitters of the present invention are electron beam ultra-nano-lithography, ultra-high density data storage and retrieval, nanomanipulation, nano-processing, nano-assembly, alternatives to VMED (vacuum micro-electronic device) displays, and integration of nano-emitters with ultra-thin-walled ultra-micro-pipette nano-channels for imaging/spectroscopy of hydrated biomolecules.

It is, therefore, apparent that there has been provided, in accordance with the present invention, a solid state sub-nanometer-scale electron beam emitter, and a nano-sandwich Einzel electron beam lens. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

I claim:

1. A solid state sub-nanometer-scale electron beam emitter comprising a nano-tip electron emitter and tunnel emission junction formed on substrate, an initial electron beam extraction electrode, and an electron beam lens wherein said electron beam lens includes a nano-sandwich Einzel lens electrode and wherein said nano-sandwich Einzel lens electrode includes a lower primary electron beam acceleration electrode, an annular metal electrode, and an upper metal membrane electrode.

2. The emitter as recited in claim 1, wherein said initial electron beam extraction electrode also forms said lower primary electron beam acceleration electrode of said nano-sandwich Einzel lens electrode.

3. The emitter as recited in claim 1, further comprising a spacing layer disposed between said initial electron beam extraction electrode and said lower metal membrane and primary electron beam acceleration electrode of said nano-sandwich Einzel lens electrode.

4. The emitter as recited in claim 1, wherein said lower primary electron beam acceleration electrode has a thickness between about 1 nanometer and about 10 nanometers, said annular metal electrode has a thickness between about 1 nanometer and about 10 nanometers, and said upper metal membrane electrode has a thickness between about 1 nanometer and about 10 nanometers.

5. The emitter as recited in claim 4, wherein said annular metal electrode has an opening through which electrons pass of between about 10 nanometers and about 100 nanometers in diameter.

6. The emitter as recited in claim 1, wherein said nano-sandwich Einzel lens electrode comprises an interior region devoid of material and forming a nano-vacuum chamber.

7. The emitter as recited in claim 1, wherein said nano-sandwich Einzel lens electrode comprises an interior region consisting essentially of an electron transparent material.

8. The emitter as recited in claim 1, further comprising an electron transparent protective layer disposed upon said nano-sandwich Einzel lens electrode.

9. The emitter as recited in claim 8, wherein said electron transparent protective layer consists essentially of a material selected from the group consisting of diamond, silicon nitride, and aluminum nitride.

10. The emitter as recited in claim 1, wherein said emitter is formed with a substantially cylindrical shape.

11. The emitter as recited in claim 1, wherein said substrate consists essentially of silicon.

12. The emitter as recited in claim 1, wherein said nano-tip electron emitter is embedded in a spacing layer that separates said nano-tip electron emitter from said initial electron beam extraction electrode.

13. The emitter as recited in claim 12, wherein said spacing layer consists essentially of diamond.

14. The emitter as recited in claim 1, wherein said nano-tip electron emitter is formed with a conical shape.

15. The emitter as recited in claim 14, wherein said nano-tip electron emitter extends from said substrate a distance of between about 20 nanometers and about 80 nanometers.

16. The emitter as recited in claim 1, wherein said nano-tip electron emitter comprises a tungsten tetrahedral tip.

17. The emitter as recited in claim 1, wherein said nano-tip electron emitter comprises a carbon nanotube.

18. The emitter as recited in claim 1, wherein said nanotip electron emitter comprises a C.sub.60 buckyball.

19. A solid state sub-nanometer-scale electron beam emitter comprising a nano-tip electron emitter and tunnel emission junction formed on substrate, an initial electron beam extraction electrode, and a protective layer disposed on said initial electron beam extraction electrode.

20. A nano-sandwich Einzel lens for directing an electron beam, said lens comprising a lower primary electron beam acceleration electrode, an annular metal electrode, and an upper metal membrane electrode.

21. The lens as recited in claim 20, wherein said lower primary electron beam acceleration electrode is separated from said annular metal electrode by a first electron transparent spacing layer and said annular metal electrode is separated from said upper metal membrane electrode by a second electron transparent spacing layer.

22. The lens as recited in claim 21, wherein said first electron transparent spacing layer and said second electron transparent spacing layer consist essentially of a material selected from the group consisting of diamond, silicon nitride, and aluminum nitride.

23. The lens as recited in claim 20, wherein an electron directing voltage is applied to said annular metal electrode.

24. The lens as recited in claim 20, wherein said annular metal electrode is unitary.

25. The lens as recited in claim 20, wherein said annular metal electrode is segmented into at least a first segment and a second segment.

26. The lens as recited in claim 25, wherein a first electron directing voltage is applied to said first segment of said annular metal electrode and a second electron directing voltage is applied to said second segment of said annular metal electrode.

27. The lens as recited in claim 25, wherein said annular metal electrode is segmented into four segments at approximately 90 degree intervals.

* * * * *